(12) United States Patent
Sugizaki et al.

(10) Patent No.: US 8,110,421 B2
(45) Date of Patent: Feb. 7, 2012

(54) LIGHT EMITTING DEVICE AND METHOD FOR MANUFACTURING SAME

(75) Inventors: Yoshiaki Sugizaki, Kanagawa-ken (JP); Hideki Shibata, Kanagawa-ken (JP); Masayuki Ishikawa, Kanagawa-ken (JP); Hideo Tamura, Kanagawa-ken (JP); Tetsuro Komatsu, Kanagawa-ken (JP); Akihiro Kojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 12/505,759

(22) Filed: Jul. 20, 2009

(65) Prior Publication Data

US 2010/0148198 A1    Jun. 17, 2010

(30) Foreign Application Priority Data

Dec. 12, 2008   (JP) ................. 2008-316752

(51) Int. Cl.
*H01L 21/66*   (2006.01)
*H01L 33/00*   (2010.01)

(52) U.S. Cl. ............ 438/26; 438/27; 257/98; 257/99; 257/E33.057; 257/E33.061; 257/E33.063; 257/E21.511

(58) Field of Classification Search ........ 438/26, 438/27; 257/98, 99, E33.057, E33.061, E33.063, 257/E21.511
See application file for complete search history.

(56) References Cited

U.S. PATENT DOCUMENTS

| | | | |
|---|---|---|---|
| 6,121,689 A | | 9/2000 | Capote et al. |
| 6,331,450 B1 * | | 12/2001 | Uemura ................... 438/114 |
| 2006/0151802 A1 * | | 7/2006 | Tsuchiya et al. .......... 257/99 |
| 2007/0096130 A1 * | | 5/2007 | Schiaffino et al. ........ 257/98 |
| 2007/0262338 A1 * | | 11/2007 | Higashi et al. ............ 257/99 |
| 2007/0267650 A1 * | | 11/2007 | Hsieh ...................... 257/99 |
| 2008/0210955 A1 | | 9/2008 | Uemura et al. |
| 2010/0140640 A1 | | 6/2010 | Shimokawa et al. |

(Continued)

FOREIGN PATENT DOCUMENTS

EP    0 704 899 A2    4/1996

(Continued)

OTHER PUBLICATIONS

U.S. Appl. No. 12/793,943, filed Jun. 4, 2010, Kojima.

(Continued)

*Primary Examiner* — Zandra Smith
*Assistant Examiner* — Jeremy Joy
(74) *Attorney, Agent, or Firm* — Oblon, Spivak, McClelland, Maier & Neustadt, L.L.P.

(57) ABSTRACT

A method for manufacturing a light emitting device includes: forming a multilayer body including a light emitting layer so that a first surface thereof is adjacent to a first surface side of a translucent substrate; forming a dielectric film on a second surface side opposite to the first surface of the multilayer body, the dielectric film having a first and second openings on a p-side electrode and an n-side electrode provided on the second surface; forming a seed metal on the dielectric film and an exposed surface of the first and second openings; forming a p-side metal interconnect layer and an n-side metal interconnect layer on the seed metal; separating the seed metal into a p-side seed metal and an n-side seed metal by removing a part of the seed metal, which is provided between the p-side metal interconnect layer and the n-side metal interconnect layer; and forming a resin in a space from which the seed metal is removed.

16 Claims, 20 Drawing Sheets

U.S. PATENT DOCUMENTS

| | | |
|---|---|---|
| 2010/0211735 A1 | 8/2010 | Sasakawa |
| 2011/0027921 A1 | 2/2011 | Hamasaki |
| 2011/0073889 A1 | 3/2011 | Sugizaki |
| 2011/0073890 A1 | 3/2011 | Sugizaki |
| 2011/0114978 A1 | 5/2011 | Kojima |
| 2011/0114986 A1 | 5/2011 | Kojima |
| 2011/0204396 A1 | 8/2011 | Akimoto |
| 2011/0233585 A1 | 9/2011 | Kojima |

FOREIGN PATENT DOCUMENTS

| | | |
|---|---|---|
| JP | 10-163536 | 6/1998 |
| JP | 2000-244012 | 9/2000 |
| JP | 2001-177158 | 6/2001 |
| JP | 2002-118293 | 4/2002 |
| JP | 2002118293 A * | 4/2002 |
| JP | 2003-7929 | 1/2003 |
| JP | 2004-207388 | 7/2004 |
| JP | 2005-79550 | 3/2005 |
| JP | 2005-79551 | 3/2005 |
| JP | 2005-216917 | 8/2005 |
| JP | 2006-128625 | 5/2006 |
| JP | 2007-34315 | 2/2007 |
| JP | 2007-208181 | 8/2007 |
| JP | 2007-324630 | 12/2007 |
| JP | 2008-53685 | 3/2008 |
| JP | 2008-077100 | 4/2008 |
| JP | 2008-186959 | 8/2008 |
| JP | 2010-521060 | 6/2010 |
| WO | WO 2006/035664 A1 | 4/2006 |
| WO | WO 2008/062783 A1 | 5/2008 |
| WO | WO 2008/078299 A1 | 7/2008 |
| WO | WO 2008/115213 A2 | 9/2008 |
| WO | WO 2008/115213 A3 | 9/2008 |

OTHER PUBLICATIONS

U.S. Appl. No. 12/849,098, filed Aug. 3, 2010, Kojima.
U.S. Appl. No. 12/832,275, filed Jul. 8, 2010, Kojima.
U.S. Appl. No. 12/881,618, filed Sep. 14, 2010, Furuyama.
U.S. Appl. No. 12/886,092, filed Sep. 20, 2010, Iduka.
U.S. Appl. No. 12/885,777, filed Sep. 20, 2010, Kojima.
U.S. Appl. No. 12/880,673, filed Sep. 13, 2010, Sugizaki.
U.S. Appl. No. 12/885,721, filed Sep. 20, 2010, Sugizaki.
U.S. Appl. No. 12/883,745, filed Sep. 16, 2010, Sugizaki.
U.S. Appl. No. 12/881,428, filed Sep. 14, 2010, Sugizaki.
U.S. Appl. No. 12/886,709, filed Sep. 21, 2010, Sugizaki.
U.S. Appl. No. 12/888,558, filed Sep. 23, 2010, Kojima.
U.S. Appl. No. 12/888,754, filed Sep. 23, 2010, Akimoto.
U.S. Appl. No. 12/888,757, filed Sep. 23, 2010, Akimoto.
Notification of Reason(s) for Refusal issued Oct. 19, 2010, in Japan Patent Application No. 2008-316752.
Office Action issued May 24, 2011, in European Application No. 09166830.1.

* cited by examiner

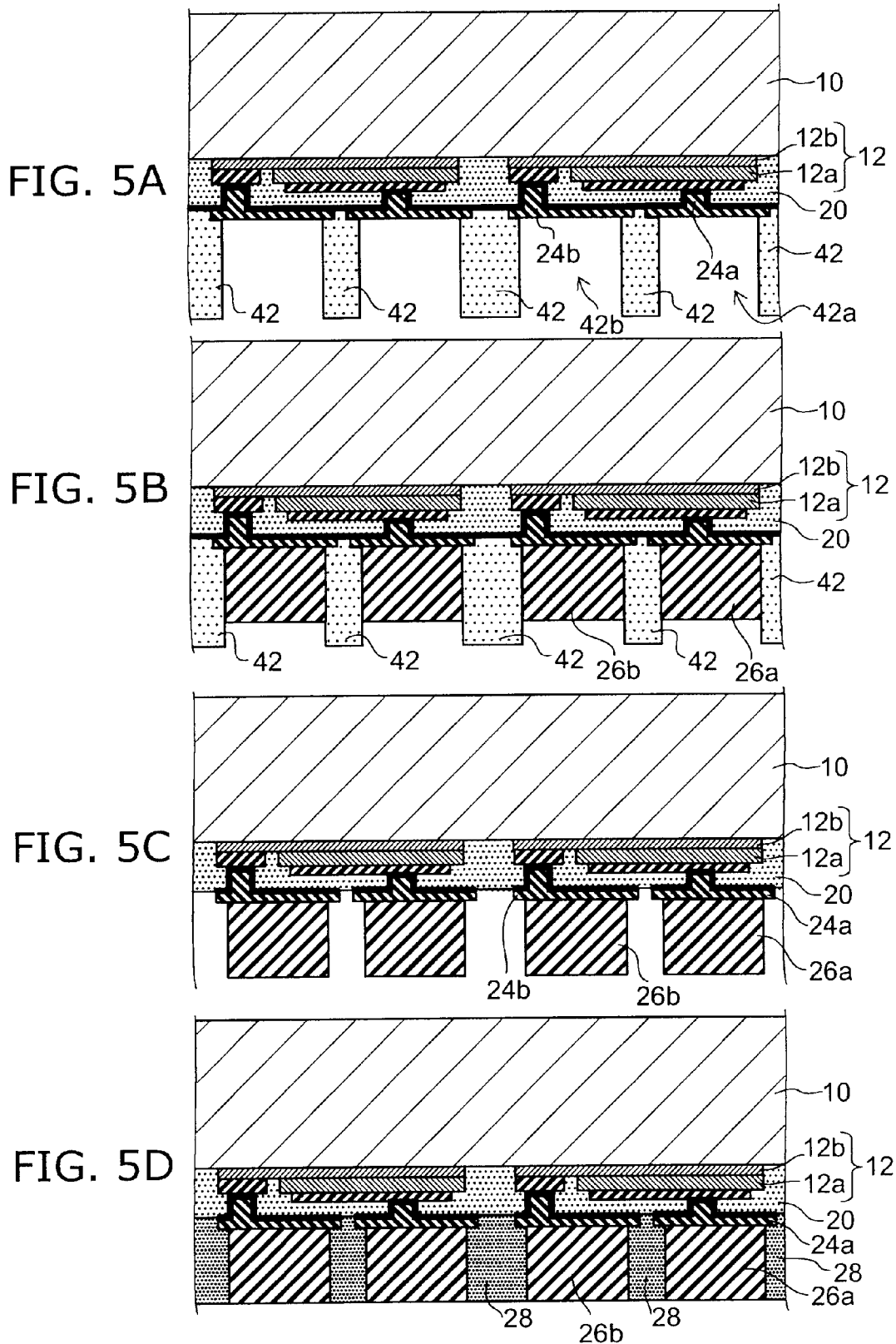

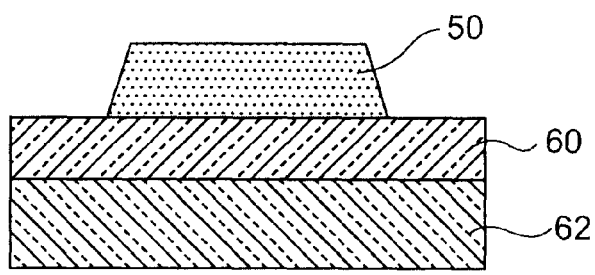
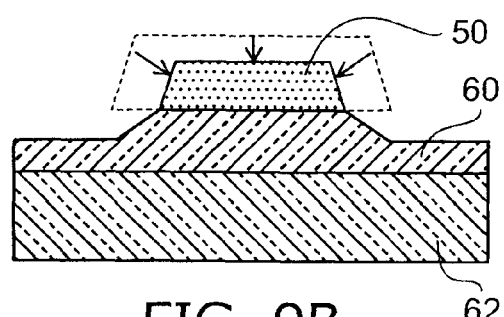
FIG. 9A           FIG. 9B
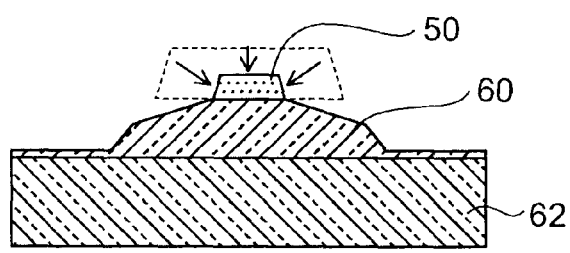
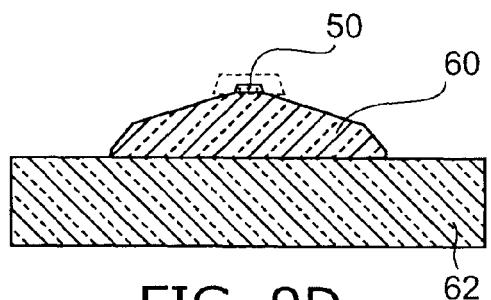
FIG. 9C           FIG. 9D
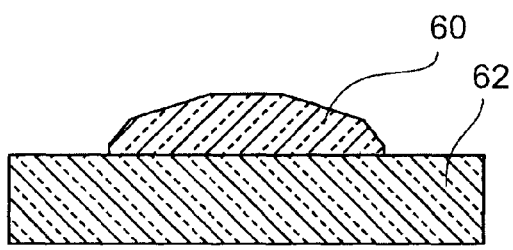
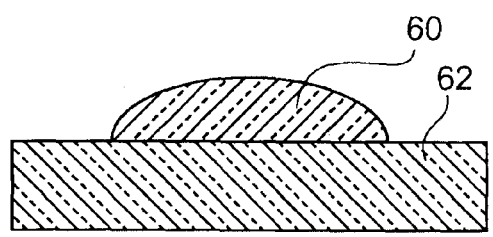
FIG. 9E           FIG. 9F

LIGHT EMITTING DEVICE AND METHOD FOR MANUFACTURING SAME

CROSS-REFERENCE TO RELATED APPLICATIONS

This application is based upon and claims the benefits of priority from the prior Japanese Patent Application No. 2008-316752, filed on Dec. 12, 2008; the entire contents of which are incorporated herein by reference.

BACKGROUND

Light emitting devices capable of emitting visible and white light are expanding their applications to, for example, illumination devices, display devices, and backlight sources for image display devices.

In these applications, there is a growing demand for downsizing. In this context, downsizing of electronic devices has been facilitated by an SMD (surface-mounted device) light emitting device in which a light emitting element chip is bonded onto a lead frame and resin-molded.

To replace fluorescent lamps and incandescent bulbs by illumination devices based on semiconductor light emitting devices having low power loss, it is necessary to enhance mass productivity and reduce cost.

JP-A-2006-128625 (Kokai) discloses an example technique for further downsizing. In this example, a light emitting element chip is flip-chip connected to an interconnect layer provided on a transparent substrate so as to be externally driven through a columnar electrode and a ball. On the transparent substrate, the light emitting element chip and the columnar electrode are covered with a sealant.

However, this example needs the interconnect layer and the columnar electrode for bonding the light emitting element chip onto the transparent substrate with high positional accuracy, and is insufficient to meet the requirements for downsizing and mass productivity.

SUMMARY

According to an aspect of the invention, there is provided a method for manufacturing a light emitting device, including: forming a multilayer body including a light emitting layer so that a first surface thereof is adjacent to a first surface side of a translucent substrate; forming a dielectric film on a second surface side opposite to the first surface of the multilayer body, the dielectric film having a first and second openings on a p-side electrode and an n-side electrode provided on the second surface; forming a seed metal on the dielectric film and an exposed surface of the first and second openings; forming a p-side metal interconnect layer and an n-side metal interconnect layer on the seed metal; separating the seed metal into a p-side seed metal and an n-side seed metal by removing a part of the seed metal, which is provided between the p-side metal interconnect layer and the n-side metal interconnect layer; and forming a resin in a space from which the seed metal is removed.

According to another aspect of the invention, there is provided a method for manufacturing a light emitting device, including: forming a light emitting element by forming a multilayer body including a light emitting layer so that a first surface thereof is adjacent to a first surface of a translucent substrate, and by forming a p-side electrode and an n-side electrode on the multilayer body, the first surface of the translucent substrate including a groove which surrounds the multilayer body; forming a dielectric film on the second surface side, the dielectric film having a first and second openings on the p-side electrode and the n-side electrode; forming a seed metal on the dielectric film and an exposed surface of the first and second openings; forming a p-side metal interconnect layer and an n-side metal interconnect layer on the seed metal; forming a p-side metal pillar and an n-side metal pillar on the p-side metal interconnect layer and the n-side metal interconnect layer, respectively; separating the seed metal into a p-side seed metal and an n-side seed metal by removing a part of the seed metal, which is provided between the p-side metal interconnect layer and the n-side metal interconnect layer; forming a resin in a space from which the seed metal is removed; and grinding the translucent substrate from a second surface opposite to the first surface so as to reach a bottom surface of the groove.

According to another aspect of the invention, there is provided a light emitting device including: a multilayer body having a first surface and a second surface opposite to the first surface and including a light emitting layer; a p-side electrode and an n-side electrode provided on the second surface of the multilayer body; a dielectric film having openings to which the p-side electrode and the n-side electrode are exposed; a p-side extraction electrode including a p-side seed metal provided on the p-side electrode and a p-side metal interconnect layer provided on the p-side seed metal; an n-side extraction electrode including an n-side seed metal provided on the n-side electrode and an n-side metal interconnect layer provided on the n-side seed metal; and a resin layer provided around the p-side extraction electrode and the n-side extraction electrode.

BRIEF DESCRIPTION OF THE DRAWINGS

FIGS. 5A to 5D are process cross-sectional views of a light emitting device according to the first embodiment;

FIGS. 9A to 9F are process cross-sectional views showing a method for forming a lens;

DETAILED DESCRIPTION OF THE INVENTION

Embodiments of the invention will now be described with reference to the drawings.

Figure 1A:
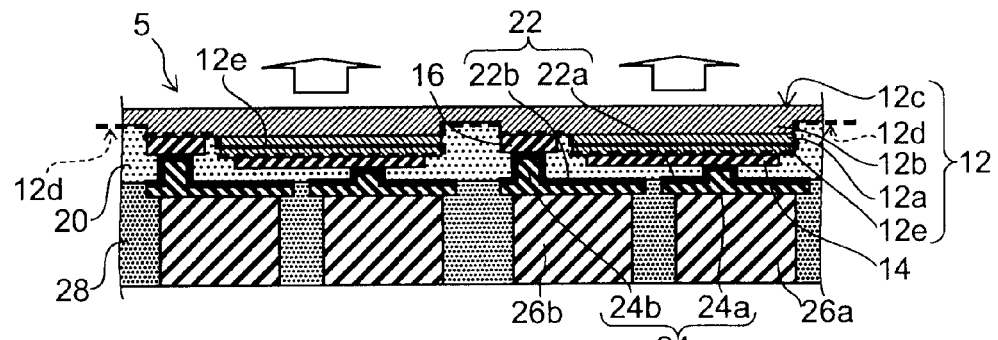
FIGS. 1A to 1C are schematic views of a light emitting device according to a first embodiment.
Figure 1B:
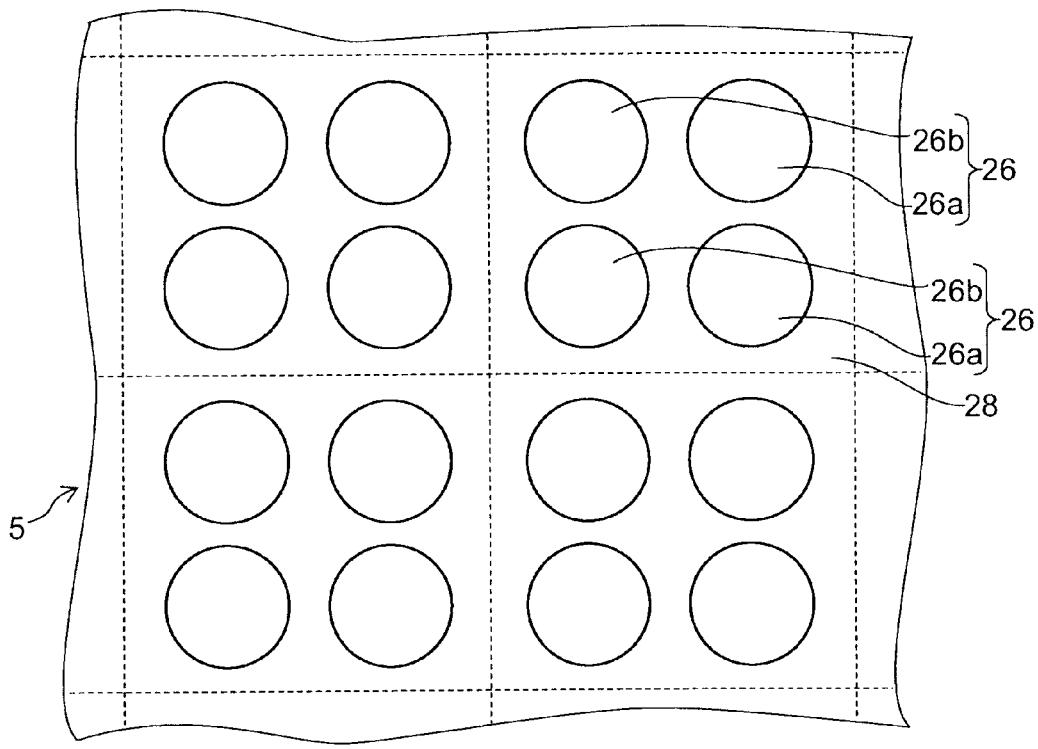

FIG. 1A is a schematic cross-sectional view of a light emitting device according to a first embodiment of the invention, and FIG. 1B is a bottom view of the light emitting device in FIG. 1A.

In FIGS. 1A and 1B, a multilayer body 12 has an upper layer 12a including a light emitting layer 12e, and a lower layer 12b, and has a first surface 12c which is exposed, and a second surface 12d on the opposite side. The upper layer 12a may include a p-type cladding layer, a light emitting layer 12e, and an n-type cladding layer. The lower layer 12b may be of n-type and serve as a lateral path of current. However, the conductivity type is not limited thereto, but may be the opposite conductivity type.

A p-side electrode 14 provided on the surface of the upper layer 12a of the multilayer body 12 is connected to a p-side metal interconnect layer 24a through a p-side seed metal 22a. Furthermore, an n-side electrode 16 is connected to an n-side metal interconnect layer 24b through an n-side seed metal 22b. A dielectric film 20 made of an organic or inorganic material is filled between the seed metal 22a, 22b and the second surface 12d.

A p-side metal pillar 26a and an n-side metal pillar 26b are provided on the p-side metal interconnect layer 24a and the n-side metal interconnect layer 24b, respectively, and surrounded by a (reinforcing) resin 28 so as to expose at least the surface of the metal pillars 26. Even if the multilayer body 12 is thin, its mechanical strength can be maintained by the metal pillars 26a, 26b and the reinforcing resin 28. The metal pillars 26 serve to reduce stress applied to the multilayer body 12 through mounting terminals.

The metal interconnect layer 24a, 24b and the metal pillar 26a, 26b can be made of a material such as copper, gold, nickel, and silver. Among them, copper is more preferable, because it has good thermal conductivity, high migration resistance, and superior adhesion to the dielectric film. Although the following embodiments assume that the material of the metal interconnect layer 24 and the metal pillar 26 is copper, it is understood that the material is not limited to copper.

The p-side seed metal 22a, the p-side copper interconnect layer 24a, and the p-side copper pillar 26a constitute a p-side extraction electrode which can be connected to the p-side electrode 14 provided in the multilayer body 12.

Furthermore, the n-side seed metal 22b, the n-side copper interconnect layer 24b, and the n-side copper pillar 26b constitute an n-side extraction electrode which can be connected to the n-side electrode 16 provided in the multilayer body 12.

In FIGS. 1A and 1B, a diameter of the copper pillar 26 is larger than a diameter of an opening portion of the copper interconnect layer 24 in contact with the p-side electrode 14 or the n-side electrode 16. Here, the shape may be other than a circle, and in that case, the area of the base of the copper pillar 26 is larger than the area of the opening portion of the copper interconnect layer 24 in contact with the p-side electrode 14 or the n-side electrode 16.

As indicated by the block arrow, light from the light emitting layer 12e can be emitted primarily from the first surface 12c of the multilayer body 12 in the upward direction of FIG. 1A.

FIGS. 1A and 1B show a light emitting device based on WLP (wafer-level package). That is, one block indicated by the dashed line in FIG. 1B corresponds to an individual light emitting device. Such wafer-level assembly facilitates implementing CSP (chip size package), where the light emitting device is downsized close to the bare chip size. Furthermore, it may be possible that there is no need to provide a sealing resin, which facilitates achieving lower profile. Thus, this embodiment can be referred to as a WLP light emitting device.

Figure 1C:
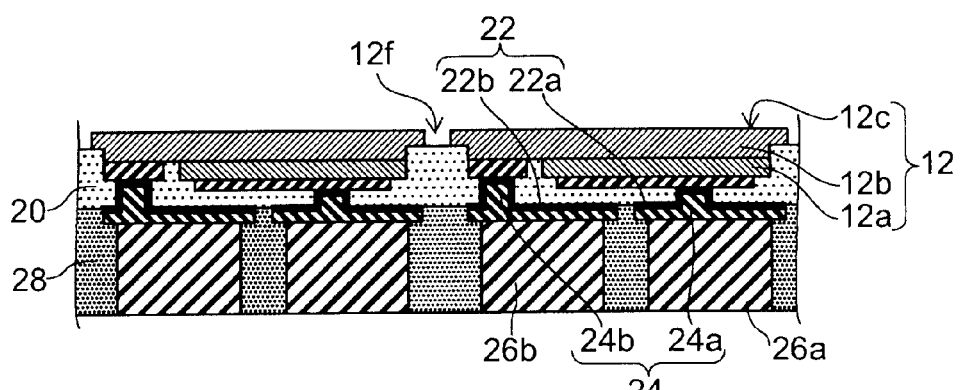

FIG. 1C shows a light emitting device according to a first variation of the first embodiment.

A separating portion 12f is provided in the multilayer body 12. In separation process into the individual light emitting device, the separation portion 12f facilitates avoiding cracking of GaN or other material, which is thin, hard, and brittle.

Figure 2A:
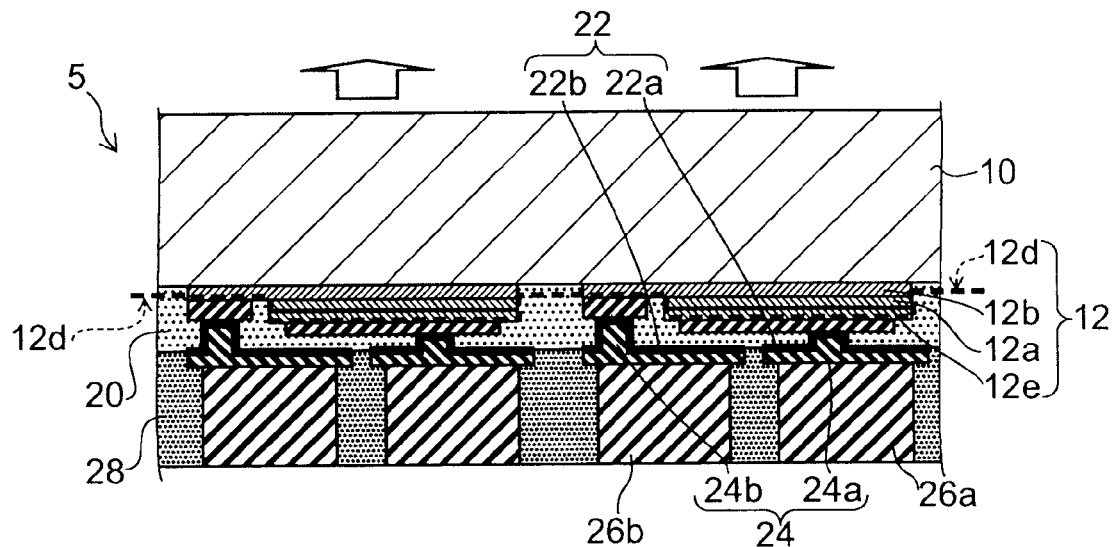
FIGS. 2A and 2B are schematic cross-sectional views of variations of the first embodiment.
Figure 2B:
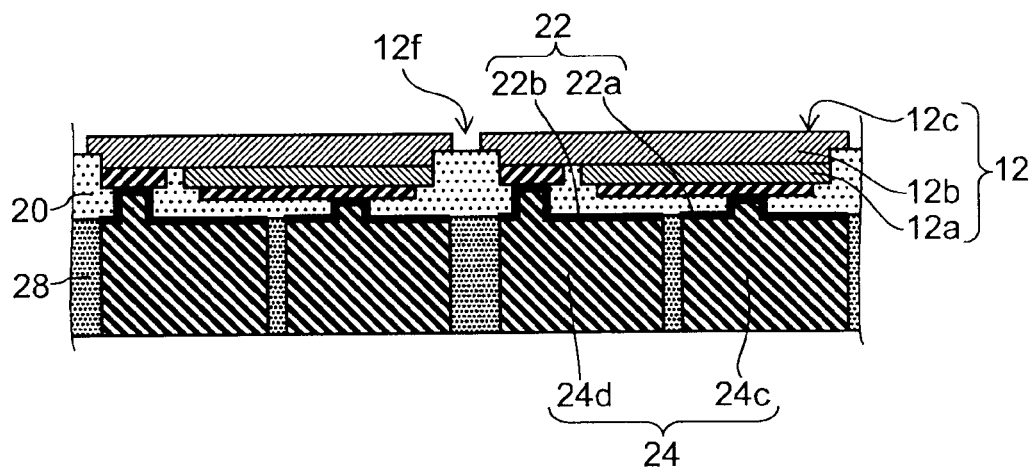

FIGS. 2A and 2B are schematic cross-sectional views of a second and third variation of the first embodiment, respectively.

In the second variation as shown in FIG. 2A, in the case where the light emitting layer 12e is made of a nitride semiconductor, the multilayer body 12 is often crystal-grown on a sapphire or other translucent substrate 10, or crystal-grown on a GaAs or other provisional substrate and then transferred onto a translucent substrate 10 by a wafer bonding process or the like. FIG. 2A shows a WLP light emitting device with the translucent substrate 10 left behind. The substrate in the crystal growth process is often as thick as several hundred μm to reduce cracking and warpage. In this embodiment, the translucent substrate 10 can be thinned by grinding, because the mechanical strength can be increased by the copper pillar 26 and the filling of the reinforcing resin 28.

The third variation as shown in FIG. 2B uses a thick copper interconnect layer 24c, 24d as an extraction electrode without providing a copper pillar. The thick copper interconnect layer 24c functions as the p-side metal interconnect layer 24a in FIG. 2A. The thick copper interconnect layer 24d functions as the n-side metal interconnect layer 24b in FIG. 2A. This can simplify the structure and manufacturing process.

FIGS. 3A to 3D show the process from the formation of a light emitting element to the film formation of a seed metal in the manufacturing method of the first embodiment.

Figure 3A:
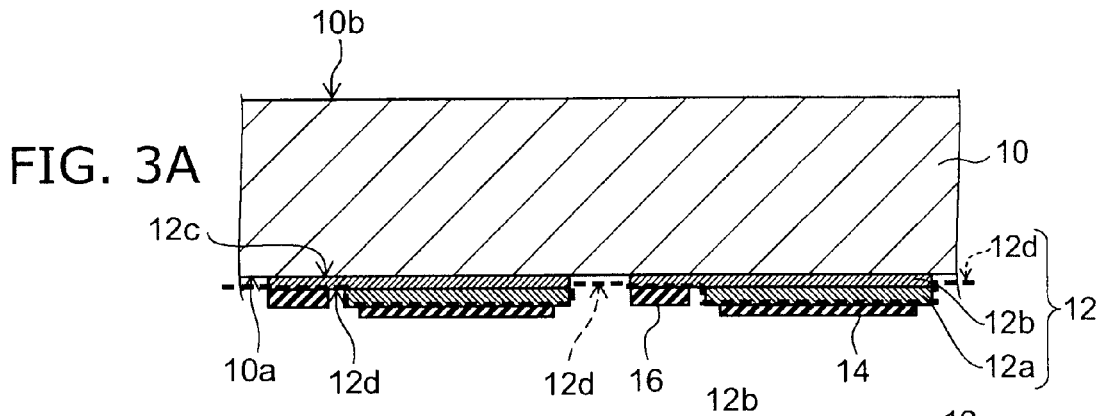
FIGS. 3A to 3D are process cross-sectional views of a light emitting device according to the first embodiment.

As shown in FIG. 3A, a multilayer body 12 having a lower layer 12b illustratively including a buffer layer and an n-type layer, and an upper layer 12a, is formed on a first surface 10a of a translucent substrate 10 illustratively made of sapphire. The first surface 12c of the multilayer body 12 is adjacent to the first surface 10a of the translucent substrate 10. The second surface (dashed line) 12d of the multilayer body 12 includes the surface of the upper layer 12a and the surface of the lower layer 12b exposed by removal of the upper layer 12a, and thus has a step difference. The lower layer 12b is provided in an upward position as compared to the upper layer 12a. The upper or lower is called, if FIG. 3A is upside-down. Generally, the lower layer 12b is grown on the translucent substance 10, and the upper layer 12a is grown on the lower layer 12b.

Figure 3B:
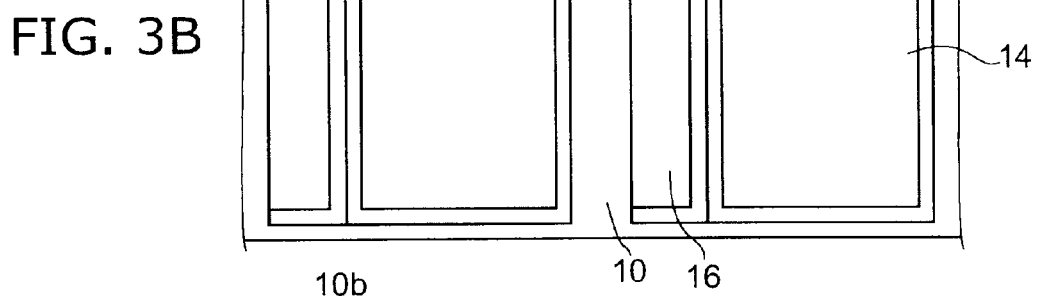
Figure 3C:
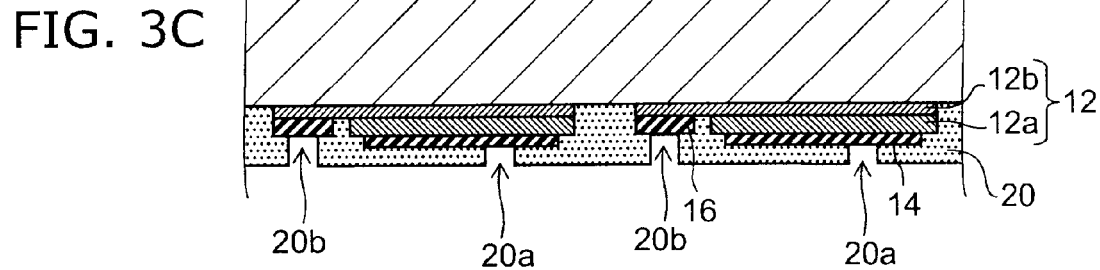
Figure 3D:
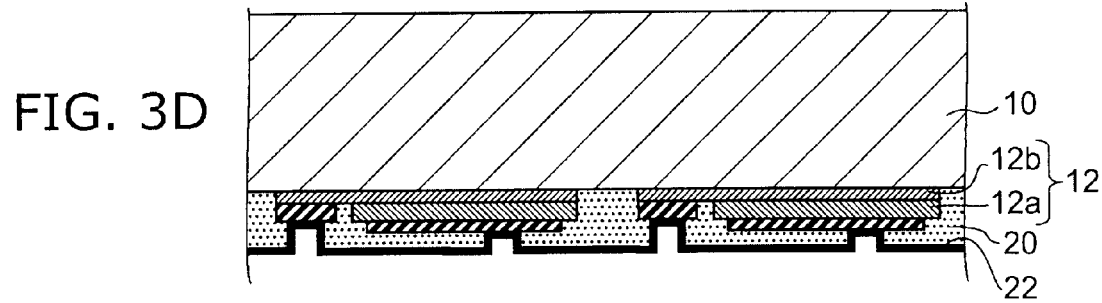

A p-side electrode 14 is formed on the surface of the upper layer 12a, and an n-side electrode 16 is formed on the surface of the lower layer 12b. The result is as shown in FIG. 3A. FIG. 3B shows the electrode pattern which is a plan view from a bottom side of FIG. 3A. A dielectric film 20 is formed so as to cover the p-side electrode 14 and the n-side electrode 16, and openings (first opening and second opening) 20a, 20b are formed so as to expose part of the p-side electrode 14 and the n-side electrode 16, respectively (FIG. 3C). Furthermore, a seed metal 22 illustratively made of Ti/Cu is formed by sputtering, for example (FIG. 3D).

Here, for example, the n-side electrode 16 can be a multilayer of Ti/Al/Pt/Au, and the p-side electrode 14 can be a multilayer of Ni/Al (or Ag)/Au. In the p-side electrode 14, sandwiching a high-reflection film illustratively made of Al or Ag facilitates reflecting upward the emission light from the light emitting layer 12e to extract a high optical output. Furthermore, because the seed metal 22 is provided, a pad made of Au can be omitted.

Figure 4A:
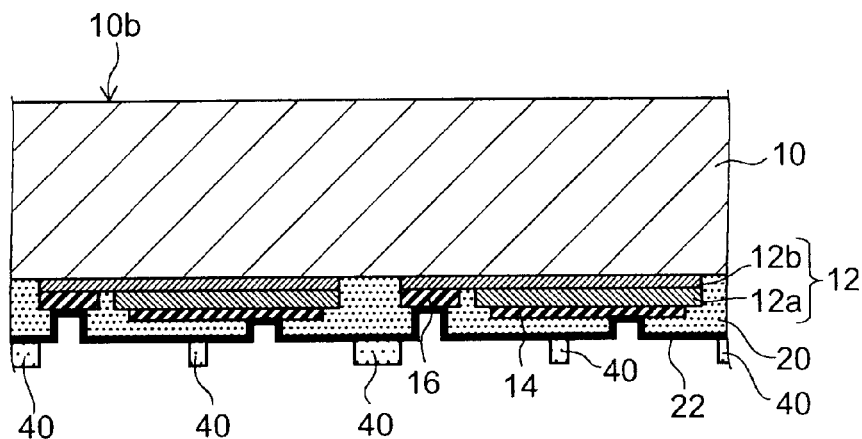
FIGS. 4A to 4C are process cross-sectional views of a light emitting device according to the first embodiment.
Figure 4B:
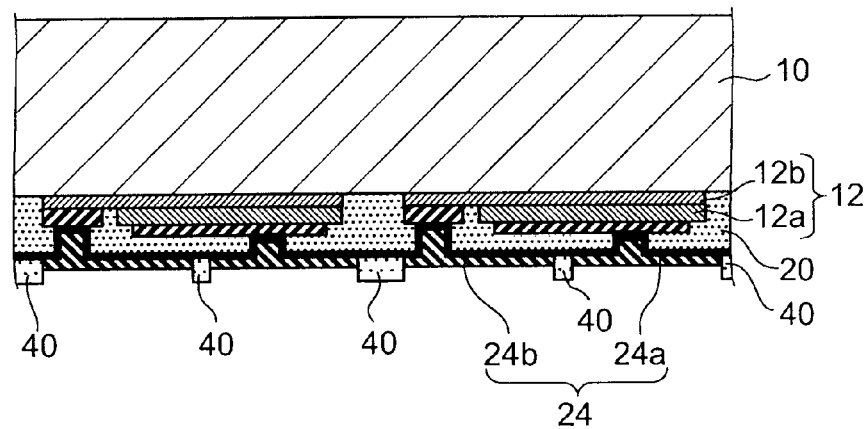
Figure 4C:
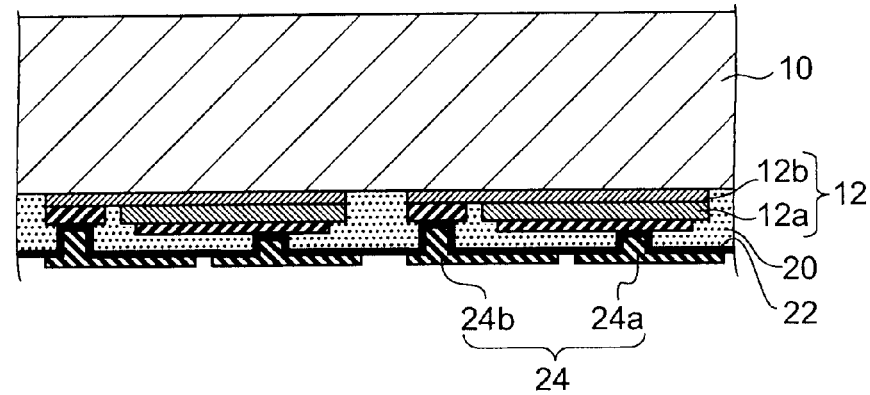

FIGS. 4A to 4C are process cross-sectional views showing the process for forming copper interconnect layers in the manufacturing method of the first embodiment.

For example, a photoresist 40 is patterned on the seed metal 22 (FIG. 4A), and the patterned photoresist 40 is used as a mask to selectively form copper interconnect layers 24 by electrolytic plating. Thus, copper interconnect layers 24a, 24b separated from each other are formed (FIG. 4B). Preferably, the copper interconnect layers 24a, 24b are formed so that the diameter or the area of the base of the copper interconnect layer 24a, 24b is larger than that of the openings 20a, 20b. Here, the thin seed metal 22 serves as a current path in the electrolytic plating process. Subsequently, the photoresist 40 is removed illustratively by ashing, which results in the structure shown in FIG. 4C.

FIGS. 5A to 5D show the process for forming a copper pillar and reinforcing resin in the manufacturing method of the first embodiment.

As shown in FIG. 5A, a thick-film photoresist 42 is patterned to form an opening 42a on the p-side copper interconnect layer 24a and an opening 42b on the n-side copper interconnect layer 24b. Subsequently, a p-side copper pillar 26a connected to the p-side electrode 14 and an n-side copper pillar 26b connected to the n-side electrode 16 are formed by electrolytic plating (FIG. 5B). Here again, the thin seed metal 22 serves as a current path in the electrolytic plating process. If the thickness of the copper pillar 26 is in the range of e.g. 10 to several hundred μm, the strength of the light emitting device can be maintained even when the translucent substrate 10 is separated. Here, alternatively, the openings 42a, 42b may be formed in a dielectric film.

Then, the photoresist 42 is removed illustratively by ashing, and the exposed region of the seed metal 22 is removed illustratively by wet etching. Thus, the seed metal 22 is separated into a p-side seed metal 22a and an n-side seed metal 22b (FIG. 5C).

Subsequently, a reinforcing resin 28 is formed around the copper pillar 26a, 26b to a thickness generally equal to or less than the thickness of the copper pillar 26a, 26b (FIG. 5D). Thus, the WLP light emitting device of FIG. 2A is obtained. Furthermore, by removing the translucent substrate 10, the WLP light emitting device shown in FIG. 1A is obtained.

Here, the layer made of the resin and metal is flexible, and the metal is formed by plating at near room temperature. Hence, the residual stress occurring with respect to the translucent substrate 10 is relatively low. In the conventional technique for separating the multilayer body 12 from the translucent substrate 10 at wafer level, for example, it is bonded to a silicon substrate with a metal layer formed thereon using Au—Sn solder at a high temperature of 300° C. or more, and then the multilayer body 12 made of GaN is separated by laser irradiation. However, in this conventional technique, the translucent substrate and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle multilayer body 12. In contrast, in this embodiment, the residual stress is low, and the multilayer body 12 is separated in the state of being fixed to a flexible support. Hence, the device can be manufactured at high yield without trouble such as cracking in the multilayer body 12.

Furthermore, this embodiment based on WLP can readily achieve a small light emitting device close to the chip size, which is typically several hundred μm to several mm for the multilayer body 12 made of nitride materials.

Such a manufacturing method does not require mounting members such as a lead frame and ceramic substrate, and can perform the wiring process and sealing process at wafer level. Furthermore, inspection can be performed at wafer level. Hence, the productivity of the manufacturing process can be enhanced, which consequently facilitates cost reduction.

Figure 6A:
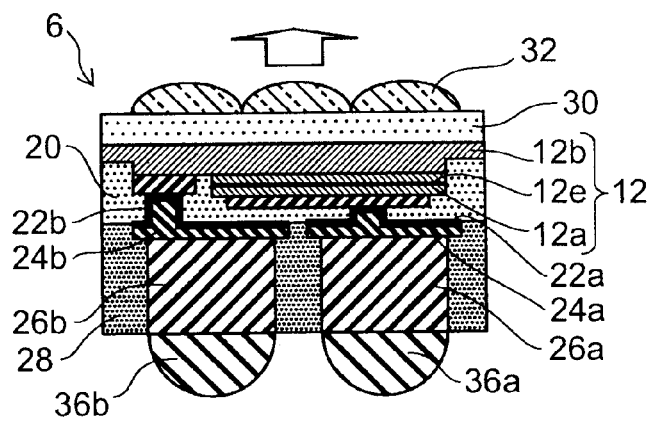
FIGS. 6A to 6D are schematic views of a light emitting device according to a second embodiment.
Figure 6B:
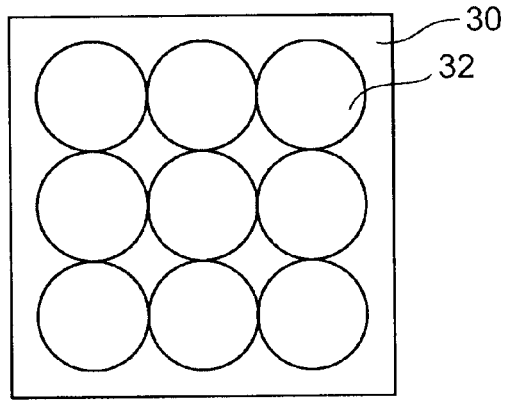
Figure 6C:
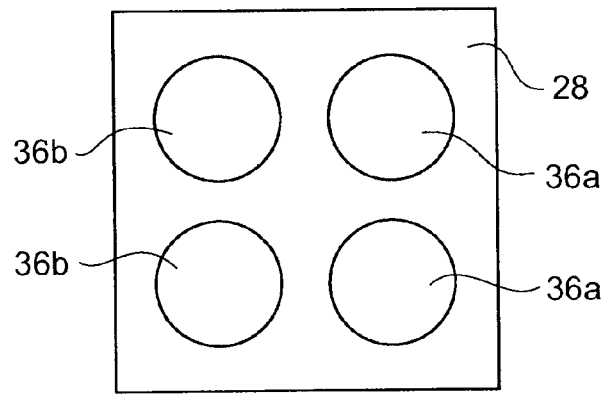
Figure 6D:
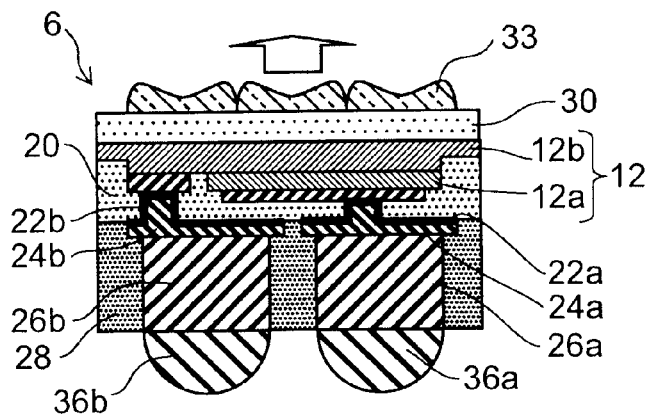

FIG. 6A is a schematic cross-sectional view of an individual light emitting device according to a second embodiment of the invention, FIG. 6B is a schematic top view, FIG. 6C is a schematic bottom view of the light emitting device in FIG. 6A, and FIG. 6D is a schematic cross-sectional view of a variation of the second embodiment.

In addition to the structure of the first embodiment shown in FIG. 1A, a solder ball 36a and a solder ball 36b are provided on the surface of the copper pillar 26a and the surface of the copper pillar 26b, respectively, in a BGA (ball grid array) configuration. The material of the solder ball 36 is not limited, but can be lead-free by using SnAg, for example.

On the other hand, a phosphor layer 30 is provided to a illustratively uniform thickness on the first surface 12c of the multilayer body 12. The phosphor layer 30 can absorb emission light from the light emitting layer 12e and emit wavelength-converted light. Thus, mixed light of the emission light from the light emitting layer 12e and the wavelength-converted light can be emitted. If the light emitting layer 12e is nitride-based, a white color, warm white color and the like can be obtained as a mixed color of the blue light, which is the emission light, and the yellow light, which is the wavelength-converted light from a yellow phosphor.

In this embodiment, a phosphor layer 30 having a substantially uniform thickness is provided near the light emitting layer 12e, and emission light is injected into the phosphor layer 30 before diverging. Hence, the spread of light of the emission light from the light emitting layer is made close to that of the wavelength-converted light, which facilitates reducing color unevenness.

Furthermore, as shown in FIG. 6A, a convex lens 32 illustratively made of quartz glass can be further provided on the phosphor layer 30 to converge the mixed light of white or warm white color, for example, which facilitates achieving higher brightness. Furthermore, because the convex lens 32 is provided near the light emitting layer 12e without the intermediary of a sealing resin, the size of the lens can be decreased, which facilitates downsizing the device.

Thus, WLP facilitates downsizing the light emitting device. Furthermore, because the convex lens 32 can be formed in the wafer state, an assembly process with high productivity can be realized, which facilitates cost reduction. In this embodiment, the solder ball 36 provided on the surface of the copper pillar 26 facilitates installation on the mounting substrate.

In the variation shown in FIG. 6D, a concave lens 33 is provided instead of the convex lens 32 so that the emission light can diverge. For example, for use as a backlight source and the like, the emission light needs to be incident on the side surface of a light guide plate so as to spread along the surface of the light guide plate. The concave lens 33 is suitable for this case.

FIGS. 7A to 7E are process cross-sectional views of a method for manufacturing a light emitting device according to the second embodiment.

Figure 7A:
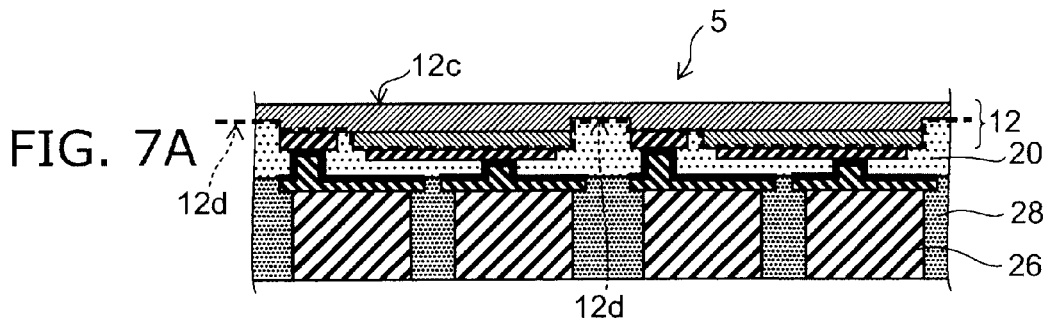
FIGS. 7A to 7E are process cross-sectional views of a light emitting device according to the second embodiment.

FIG. 7A shows a light emitting device (WLP) 5 from which the translucent substrate 10 is removed.

Figure 7B:
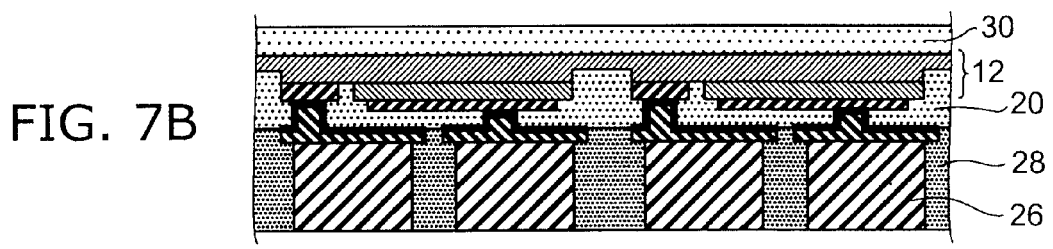
Figure 7C:
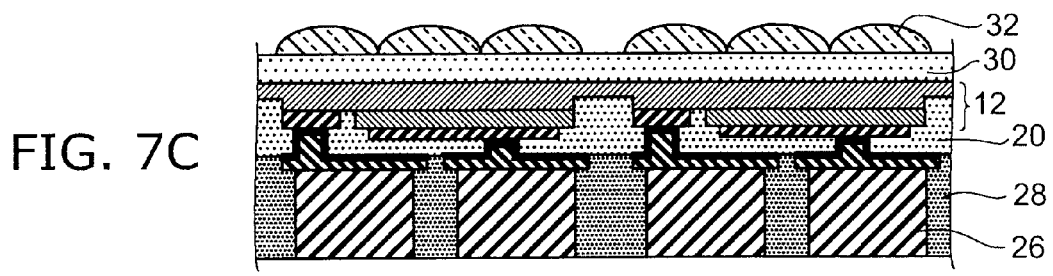
Figure 7D:
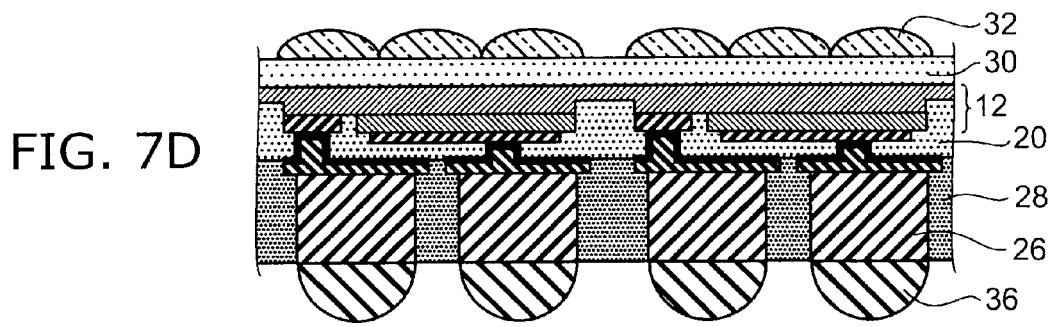
Figure 7E:
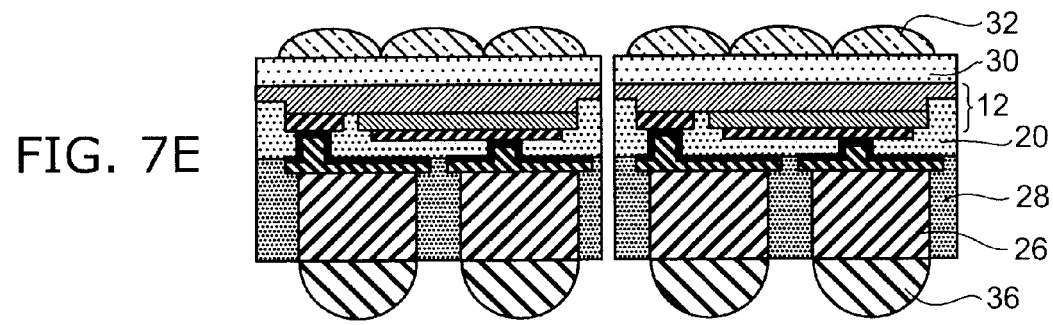

A phosphor layer 30 is formed on the first surface 12c of the multilayer body 12 which is exposed. The phosphor layer 30 can be formed to a thickness in the range from several to several hundred μm illustratively by a sputtering method, an ink-jet method, a method of applying a silicone resin mixed with phosphor particles, and a method of applying a liquid glass mixed with phosphor particles (FIG. 7B). Subsequently, a convex lens 32 is formed from quartz glass, for example (FIG. 7C), and a solder ball 36 is formed on the surface of the copper pillar 26 (FIG. 7D). Thus, a WLP-based light emitting device is completed. Furthermore, dicing is used for separation (FIG. 7E), which is easy because the translucent substrate 10 is removed. Here, cutting can be performed by a method such as mechanical cutting using a diamond blade or the like, cutting by laser irradiation, and cutting by high-pressure water.

Figure 8A:
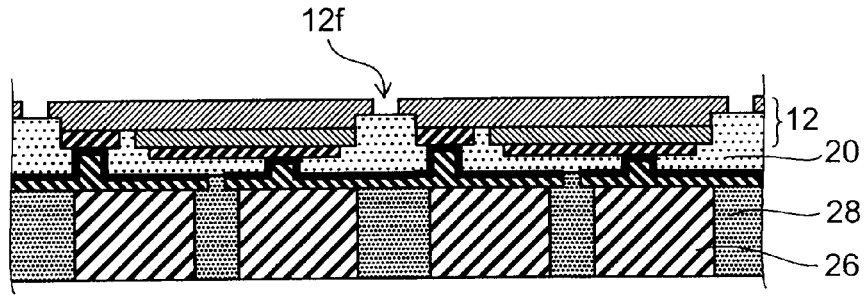
FIGS. 8A to 8C are process cross-sectional views of a manufacturing method of a first variation of the second embodiment.
Figure 8B:
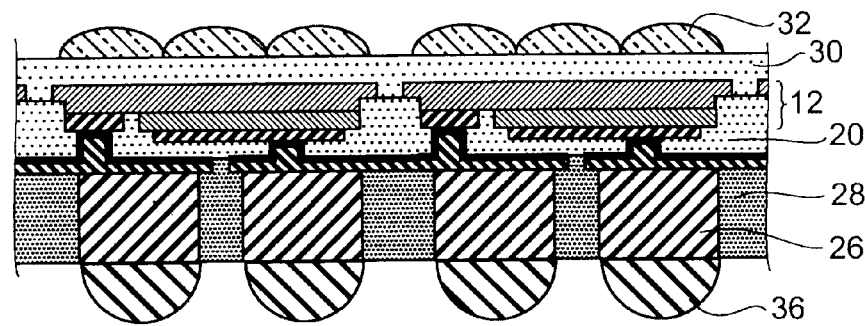
Figure 8C:
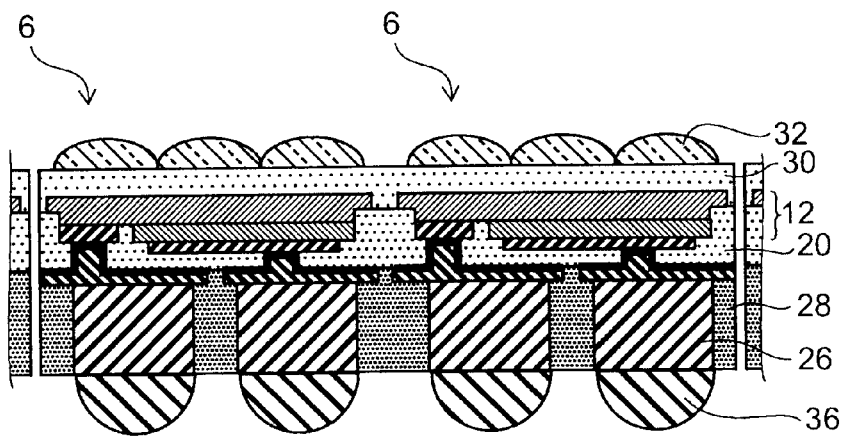

FIGS. 8A to 8C are process cross-sectional views of a manufacturing method of a first variation of the second embodiment.

In the process cross-sectional views of FIGS. 7A to 7E, the lower layer 12b of the multilayer body 12 is continuous along the first surface 10a of the translucent substrate 10. This is because the multilayer body 12 made of GaN is separated by laser irradiation more easily if the multilayer body 12 is formed entirely on the wafer. In this case, the wafer including the multilayer body 12 is desirably fixed onto a flat tool or jig by vacuum suction, adhesion or the like.

On the other hand, in the first variation, after the translucent substrate 10 is separated, the portion of the multilayer body 12 between the light emitting elements is removed illustratively by further laser irradiation while the wafer including the multilayer body 12 is fixed (FIG. 8A). Furthermore, a phosphor layer 30, a convex lens 32, and a solder ball 36 are formed (FIG. 8B), followed by separation (FIG. 8C). Alternatively, the wafer including the multilayer body 12 may be fixed to a jig which can be detached from the laser irradiation apparatus, and the multilayer body 12 may be separated by a combination of photolithography and etching. Because the multilayer body 12, which is rigid and thin, is separated into small size, the risk of cracking in the multilayer body 12 in the subsequent handling of the wafer is significantly reduced. Furthermore, also after separation, because the multilayer body 12 is separated into small size, the multilayer body 12 is resistant to cracking. Moreover, the package is flexible as a whole, which results in enhancing the reliability of connection points after mounting. Furthermore, the package has small warpage, which facilitates mounting. Moreover, it can also be mounted on an object having a curved surface.

FIGS. 9A to 9F are process cross-sectional views showing an example method for forming a lens.

A lens material made of quartz glass 60, plastic or the like is formed on the support 62 such as a semiconductor multilayer body and phosphor layer, and a dot pattern of a mask material such as a photoresist 50 is formed on the lens material (FIG. 9A). Processing with low selective ratio for the resist is performed stepwise such as the first step (FIG. 9B), second step (FIG. 9C), and third step (FIG. 9D). In each step, the portion around the photoresist 50 is sloped while the resist dot pattern is reduced by etching.

Hence, after the resist is stripped off, the cross section has a steeper slope downward (FIG. 9E). Then, mirror finishing by isotropic etching using CDE (chemical dry etching) or wet etching is performed to smooth the surface, and the lens is completed (FIG. 9F). Thus, a convex or concave lens can be formed on the light emitting device.

Figure 10A:
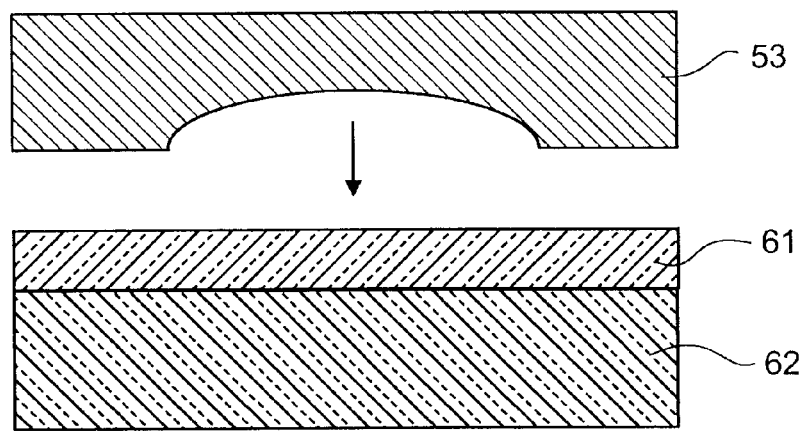
FIGS. 10A to 10C are process cross-sectional views showing another example method for forming a lens.
Figure 10B:
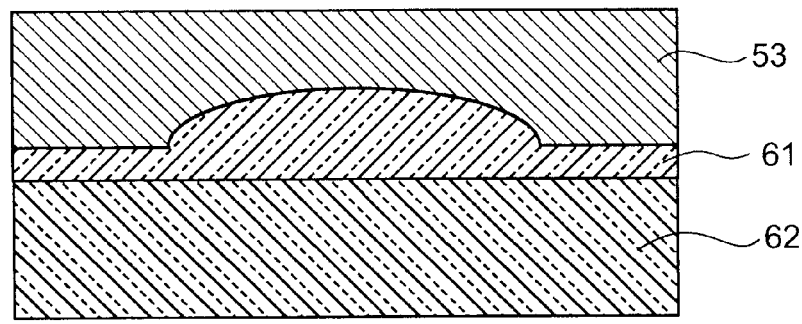
Figure 10C:
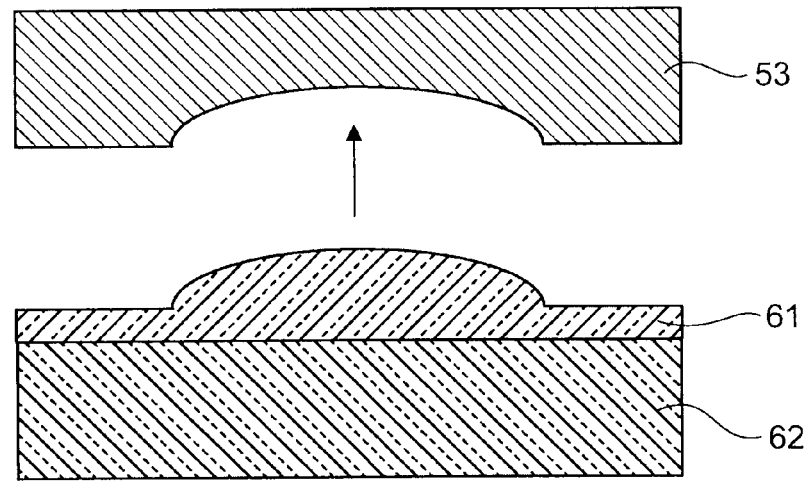

FIGS. 10A to 10C are process cross-sectional views showing another example method for forming a lens.

As shown in FIGS. 10A to 10C, it is also possible to use a imprint process. An SOG (spin on glass) 61 or the like, which is liquid and heat-vitrifiable, is applied onto the support 62 illustratively by spincoating (FIG. 10A), and a mold such as a stamper 53, which is patterned like a lens, is pressed thereto to form a lens shape (FIG. 10B). Then, the stamper 53 is stripped off, and the SOG 61 is vitrified by heating (FIG. 10C). In this process, the shape of the stamper 53 can be arbitrarily designed, and hence a lens having any shape can be readily manufactured.

FIGS. 11A to 11D are process cross-sectional views of a manufacturing method of a second variation of the second embodiment.

Figure 11A:
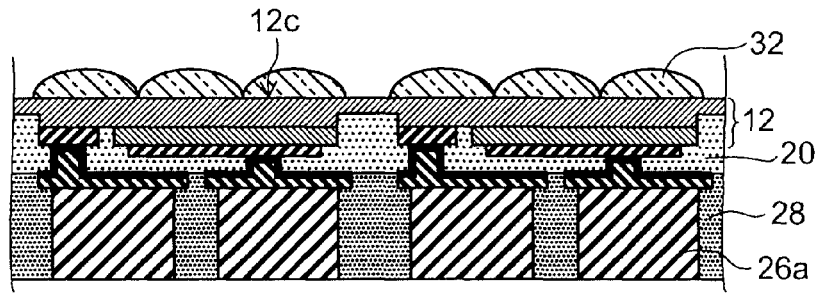
FIGS. 11A to 11D are process cross-sectional views of a manufacturing method of a second variation of the second embodiment.
Figure 11B:
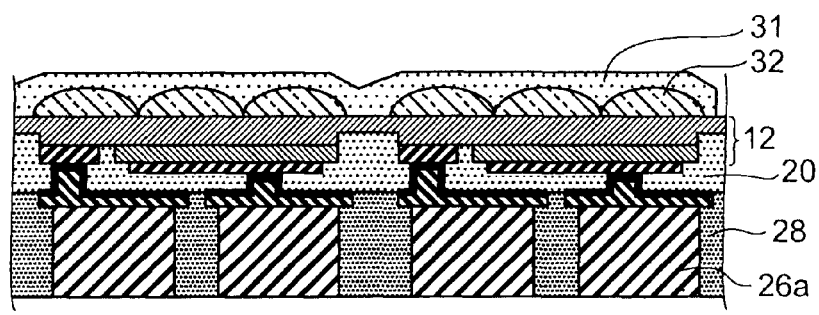
Figure 11C:
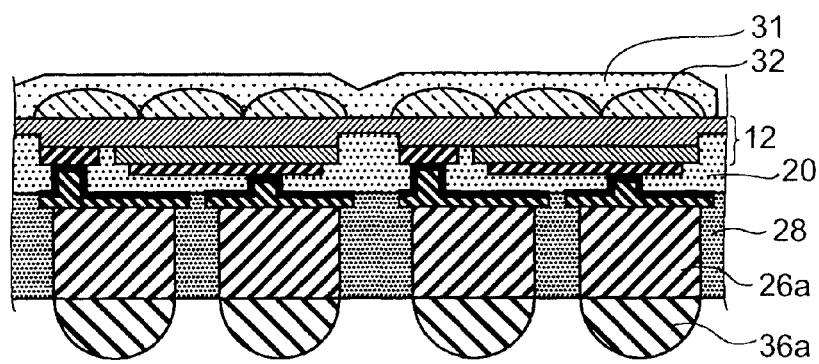
Figure 11D:
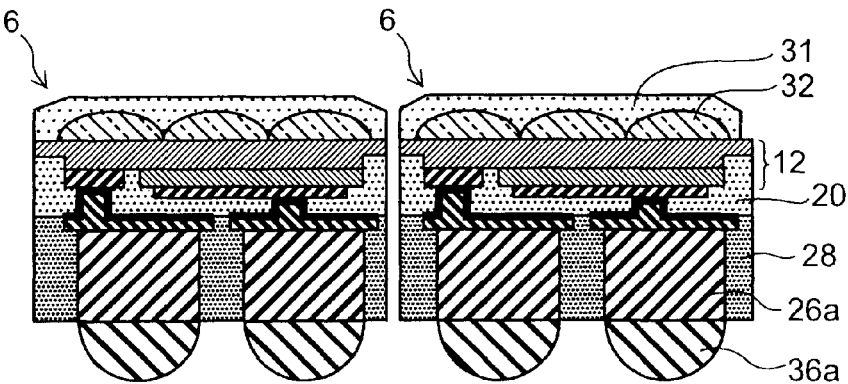
Figure 12A:
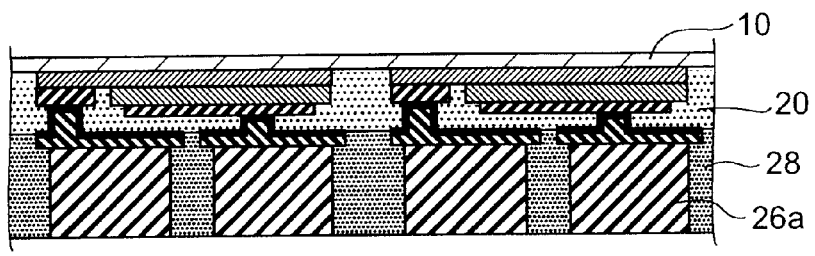
FIGS. 12A to 12E are process cross-sectional views of a method for manufacturing a light emitting device according to a third embodiment.
Figure 12B:
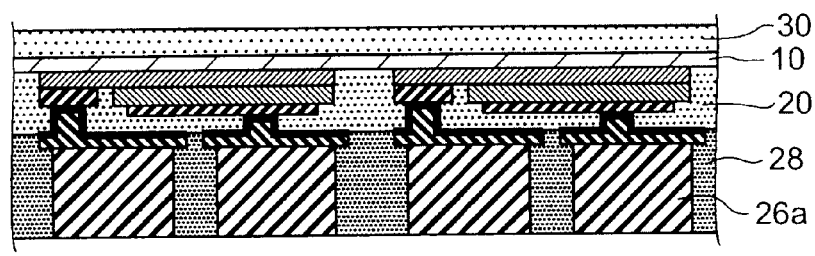
Figure 12C:
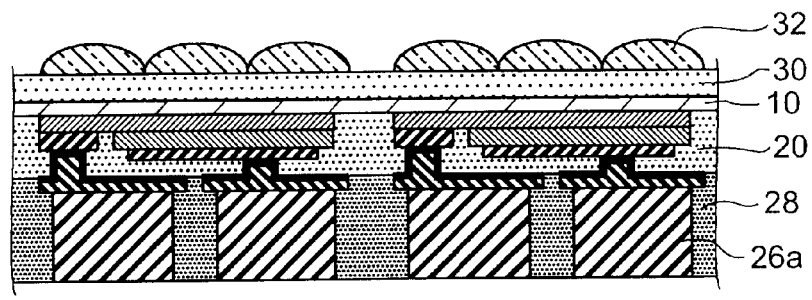
Figure 12D:
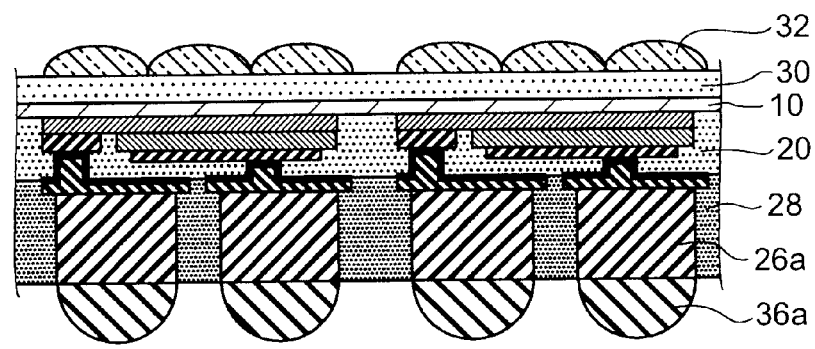
Figure 12E:
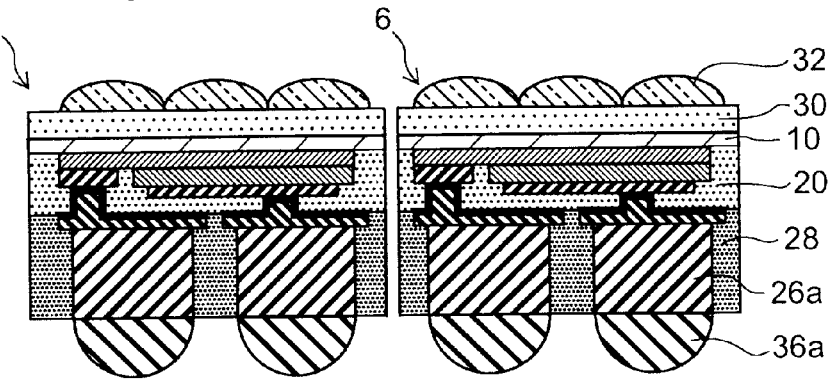

In this variation, a convex lens 32 is first formed on the first surface 12c of the multilayer body 12 (FIG. 11A), and then a phosphor layer 31 is formed on the convex lens 32 (FIG. 11B). Subsequently, a solder ball 36 is formed on the surface of the copper pillar 26 (FIG. 11C), and an individual light emitting device 6 is obtained by separation (FIG. 11D).

In the individual light emitting device 6 of the second embodiment and the variations associated therewith, the substrate of the WLP-based light emitting device is removed. Thus, a light emitting device having lower profile is provided.

FIGS. 12A to 12E are process cross-sectional views of a method for manufacturing a light emitting device according to a third embodiment.

In the variation of the first embodiment shown in FIG. 2A, the thickness of the translucent substrate 10 can be reduced by grinding. For example, leaving as much as several ten μm (FIG. 12A) facilitates enhancing the mechanical strength as compared with the structure in which the translucent substrate 10 is entirely removed. Subsequently, the processes of forming a phosphor layer 30 (FIG. 12B), forming a convex lens 32 (FIG. 12C), forming a solder ball 36 (FIG. 12D), and separation (FIG. 12E) are performed.

FIGS. 13A to 13D are process cross-sectional views of a manufacturing method of a variation of the third embodiment.

Figure 13A:
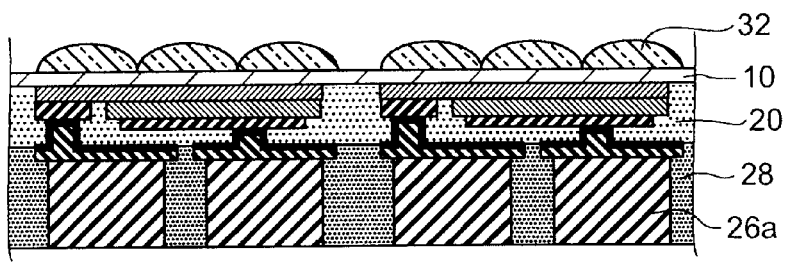
FIGS. 13A to 13D are process cross-sectional views of a manufacturing method of a variation of the third embodiment.
Figure 13B:
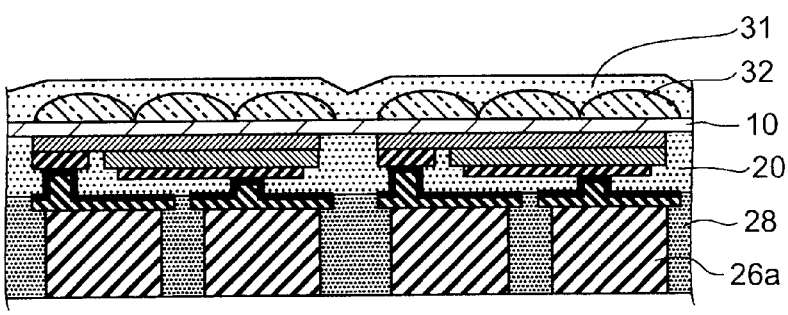
Figure 13C:
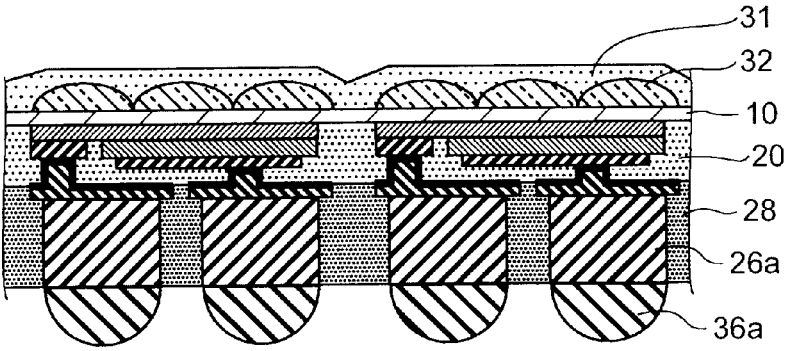
Figure 13D:
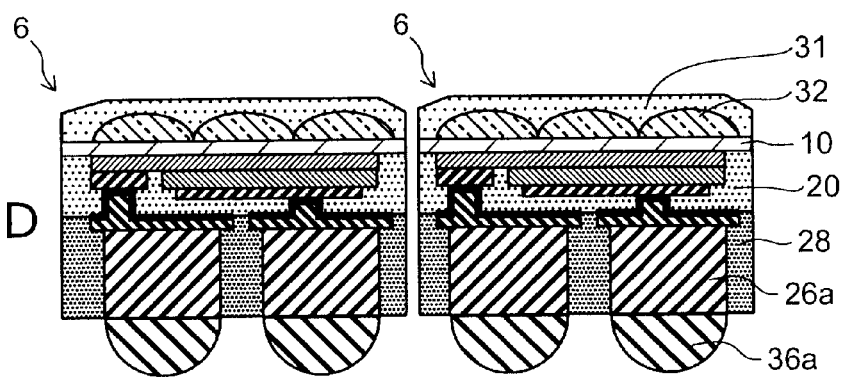

Forming a convex lens 32 as shown in FIG. 13A is followed by forming a phosphor layer 31 (FIG. 13B), forming a solder ball 36 (FIG. 13C), and separating (FIG. 13D).

In the light emitting device of the third embodiment and its variation, thinning and leaving the translucent substrate 10 facilitates enhancing the mechanical strength while keeping small thickness.

Figure 14A:
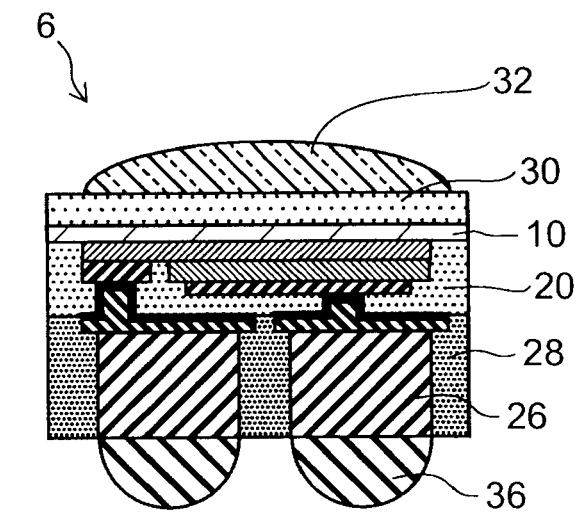
FIGS. 14A to 14C are schematic views of a light emitting device having a convex lens or a concave lens.
Figure 14B:
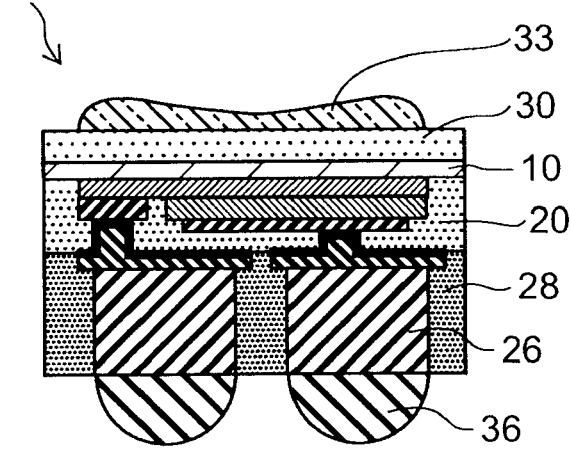
Figure 14C:
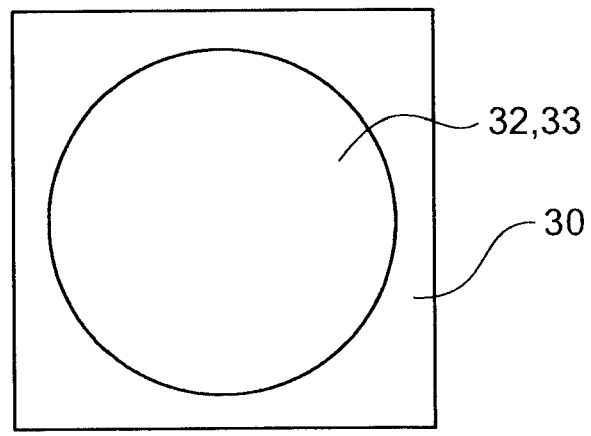

FIG. 14A is a schematic cross-sectional view of a light emitting device having a convex lens, FIG. 14B is a schematic cross-sectional view of a light emitting device having a concave lens, and FIG. 14C is a top view of the light emitting device of FIGS. 14A and 14B.

The lens in the first to third embodiment is an array lens. However, the invention is not limited thereto. It is also possible to use a single lens as shown in FIG. 14A or 14B. Use of a single lens can simplify the optical design and manufacturing process.

Figure 15A:
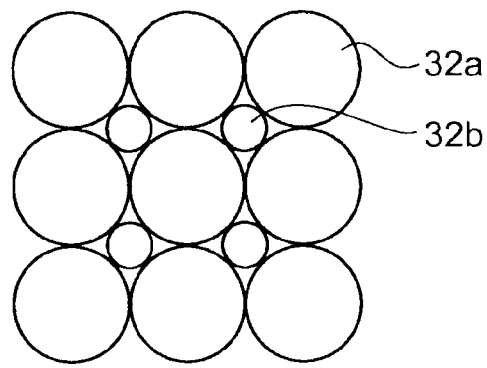
FIGS. 15A to 15C are schematic views of variations of a lens.
Figure 15B:
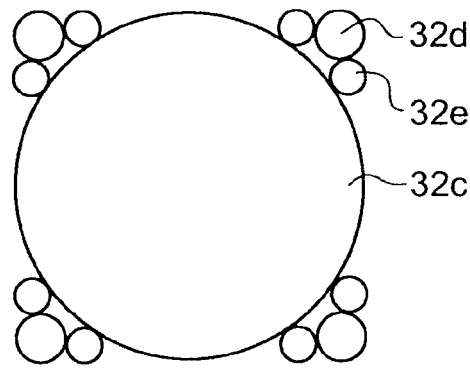
Figure 15C:
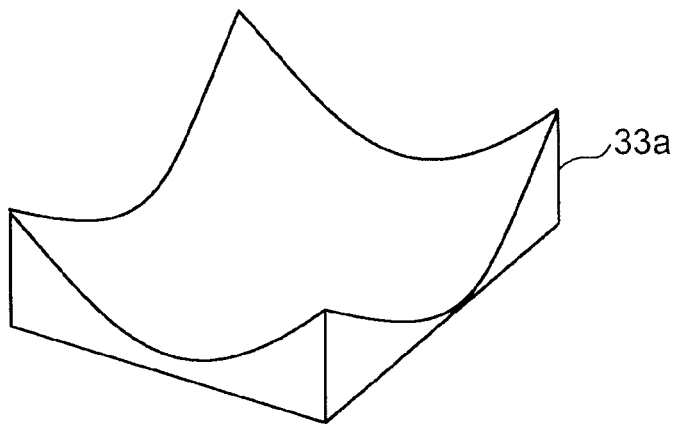

FIGS. 15A to 15C are schematic views of variations of the lens.

As shown in the plan views of FIGS. 15A and 15B, lenses 32a, 32b, 32c, 32d, 32e having different sizes may be arranged. The area covered with lenses can be increased by placing small lenses in a gap between large lenses. Furthermore, as shown in the schematic perspective view of FIG. 15C, a lens 33a having a rectangular outline may be used.

Figure 16A:
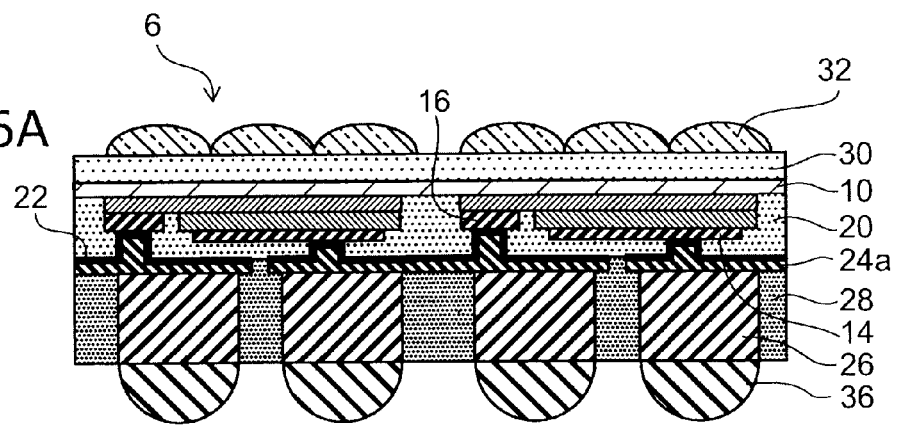
FIGS. 16A and 16B are schematic views of a light emitting device according to a fourth embodiment.
Figure 16B:
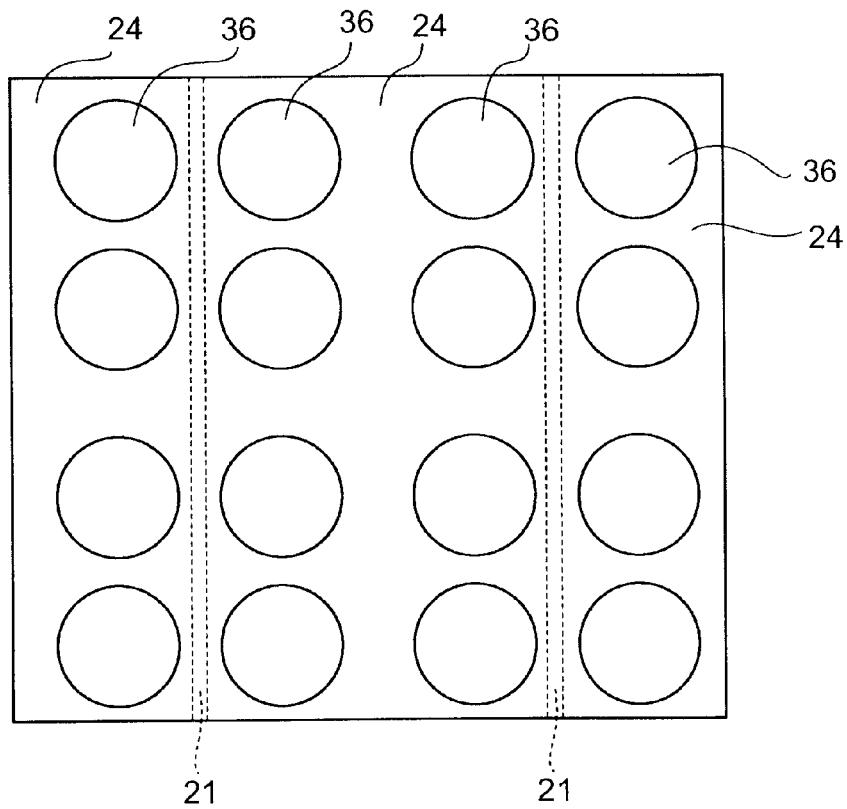

FIG. 16A is a schematic cross-sectional view of a light emitting device according to a fourth embodiment, and FIG. 16B is a bottom view thereof.

In this embodiment, adjacent multilayer bodies are spaced from each other. Patterning is performed so that the first p-side electrode 14 of the first multilayer body is connected to the second n-side electrode 16 of the second multilayer body adjacent thereto. Furthermore, the seed metal 22 between the first multilayer body and the second multilayer body may be left unremoved. Thus, the seed metal 22 and the copper interconnect layer 24 are connected between the first and second light emitting elements. That is, the two light emitting elements can be connected in series. Such series connection facilitates achieving higher output. It is understood that the number of series connection is not limited to two, but series connection with more stages is possible. Furthermore, multilayer bodies adjacent in the direction crossing the juxtaposing direction of the first and second multilayer bodies can be connected to each other to provide parallel connection.

In FIGS. 16A and 16B, the seed metal 22 and the copper interconnect layer 24 are connected among 2×2 light emitting elements. However, the 2×2 light emitting elements do not necessarily need to be separated on the outside thereof. If this configuration continues throughout the wafer, light emitting elements can be cut out in arbitrary units.

FIGS. 17A to 17E, and 18A and 18B are process cross-sectional views of a manufacturing method of a variation of the fourth embodiment.

Figure 17A:
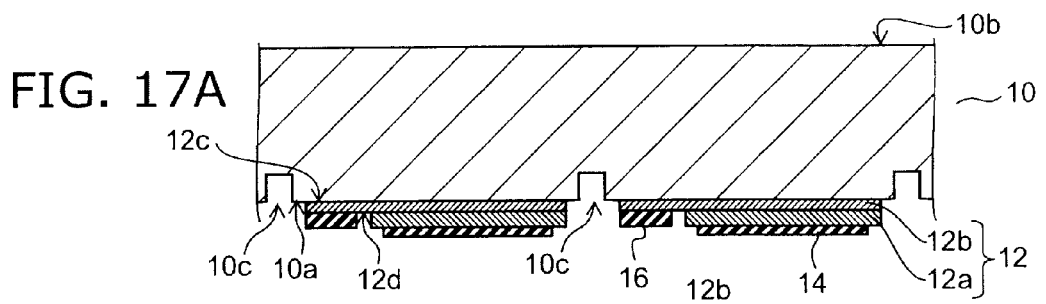
FIGS. 17A to 17E are process cross-sectional views of a manufacturing method of a variation of the fourth embodiment.
Figure 17B:
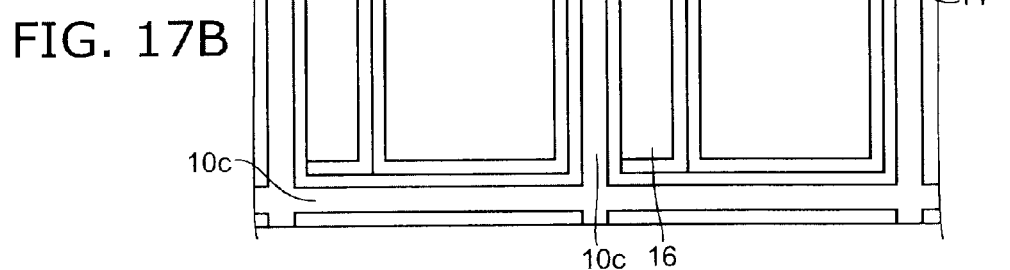
Figure 17C:
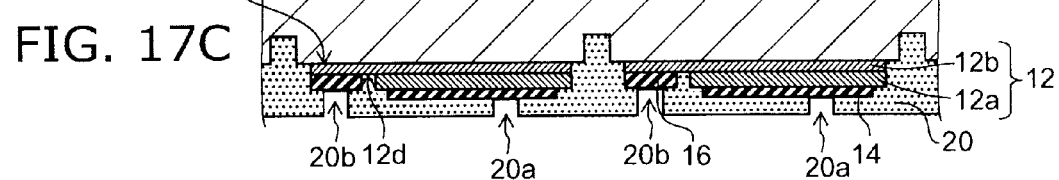
Figure 17D:
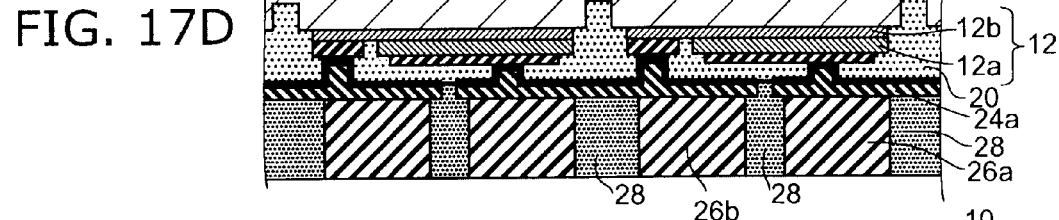
Figure 17E:
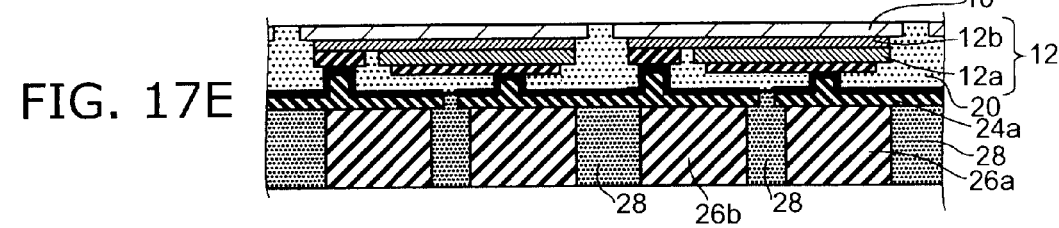
Figure 18A:
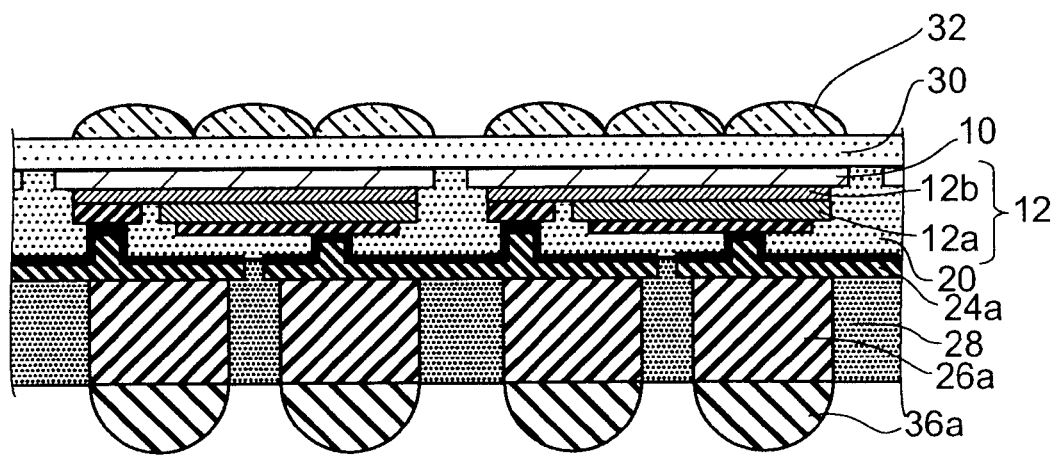
FIGS. 18A and 18B are process cross-sectional views of a manufacturing method of a variation of the fourth embodiment.
Figure 18B:
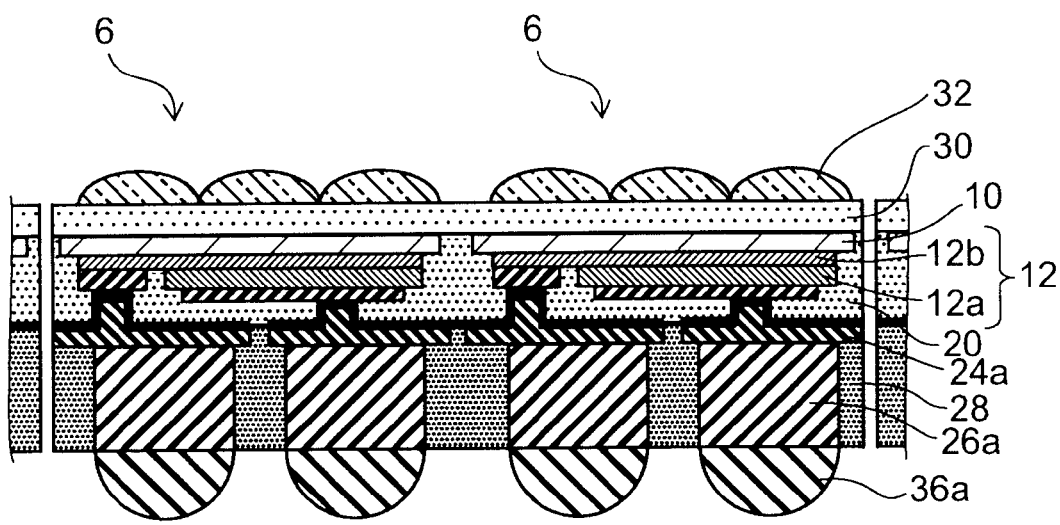

The translucent substrate 10 may be separated for each light emitting element. This can realize a reliable structure because the individual light emitting element is protected by the rigid translucent substrate 10. Furthermore, in the manufacturing method therefor, as shown in FIG. 17A, a groove 10c can be formed in the gap of the translucent substrate 10 between the light emitting elements from the light emitting element formation surface 10a side. The groove 10c can be formed illustratively before or after the step of forming the light emitting element, and can be based on a method such as etching, laser processing, and blade cutting. Then, because the rigid translucent substrate 10 is separated into small size when the translucent substrate 10 is thinly ground later (FIG. 17E), the cracking can be significantly reduced. In addition, also in separation into packages, because the portion free from the rigid translucent substrate is cut (FIG. 18B), high productivity and yield can be achieved. Furthermore, also after separation, because the translucent substrate 10 and the multilayer body 12 are separated into small size, the translucent substrate 10 and the multilayer body 12 are resistant to cracking. Moreover, the package is flexible as a whole, which results in enhancing the reliability of connection points after mounting. Furthermore, the package has small warpage, which facilitates mounting. Moreover, it can also be mounted on an object having a curved surface.

Figure 19A:
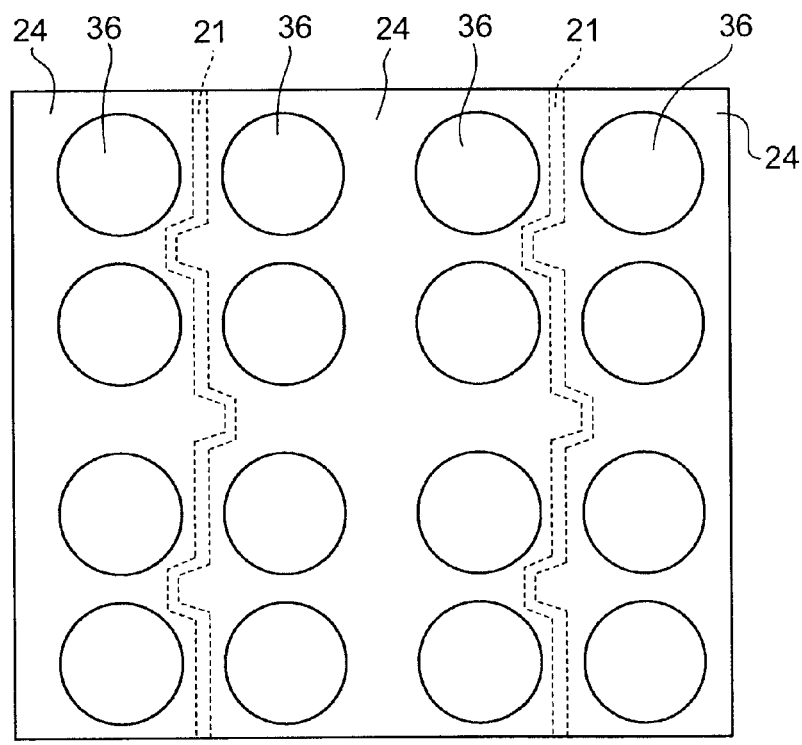
FIGS. 19A and 19B are schematic views showing variations of the pattern of a metal interconnect layer.
Figure 19B:
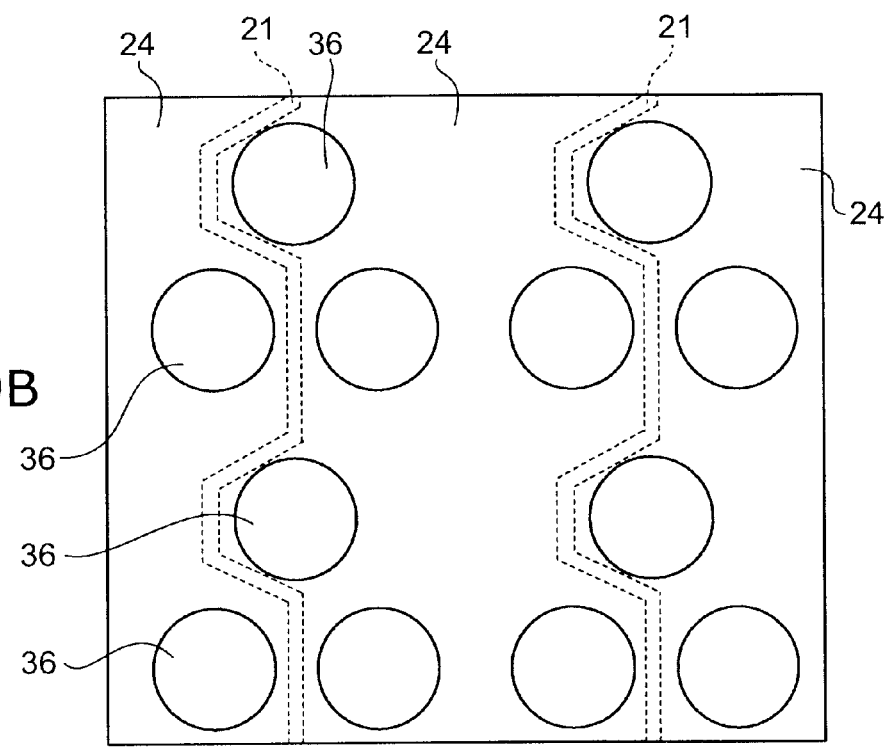

FIGS. 19A and 19B are schematic views showing a variation of the pattern of the copper interconnect layer.

In FIG. 16B, the separating region 21 between the p-side electrode 14 and the n-side electrode 16 is linear. Hence, the wafer may crack in the separating region 21. In contrast, if the separating portion (dashed line) between the p-side electrode 14 and the n-side electrode 16 is meandered as shown in FIGS. 19A and 19B, the protruding portion of the copper interconnect layer 24 serves for reinforcement, which facilitates maintaining the mechanical strength even if the translucent substrate 10 is thinned by grinding. In FIG. 19A, the copper pillars 26 are arranged in a generally lattice-like configuration. However, it is also possible to use an arrangement as shown in FIG. 19B. It is understood that the same effect is achieved also in the configuration where the translucent substrate 10 is separated.

Figure 20A:
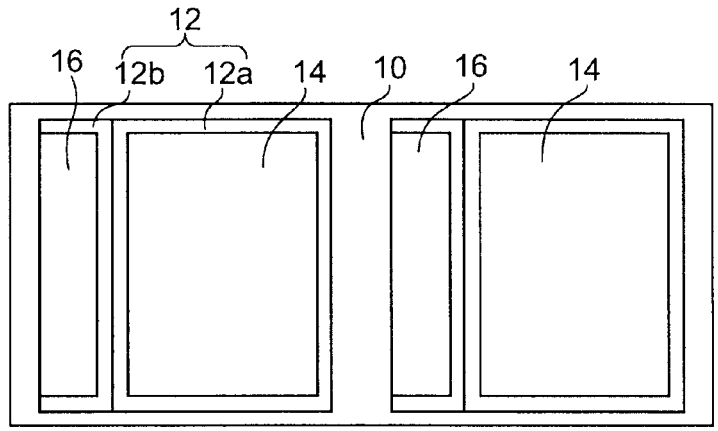
FIGS. 20A to 20D are schematic plan views showing variations of an electrode pattern.
Figure 20B:
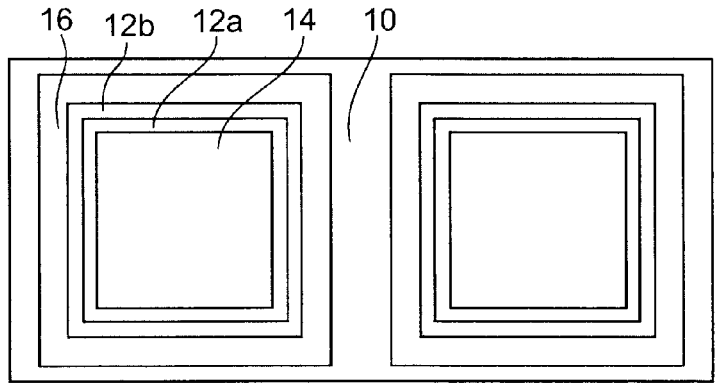
Figure 20C:
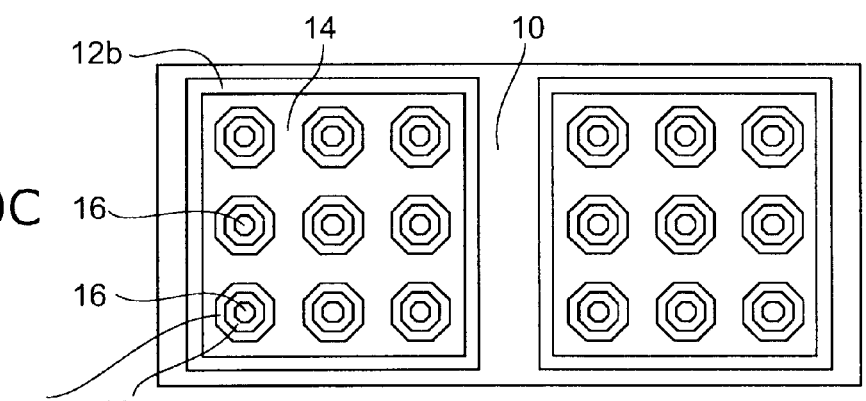
Figure 20D:
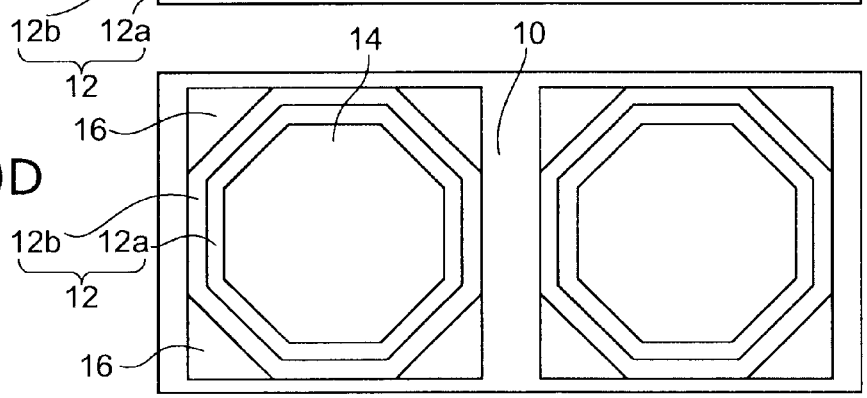

FIG. 20A is a schematic plan view of a basic electrode pattern for two light emitting element chips, and FIGS. 20B to 20D are schematic plan views of its variations.

Light emission occurs in the region where the current flows in the vertical direction of the chip. Hence, a high optical output can be achieved by increasing the area of the upper layer 12a including the light emitting layer 12e. Here, the area of the lower layer 12b exposed by removal of the upper layer 12a is an n-type non-emitting region, and low contact resistance to the n-side electrode 16 is readily achieved even if the area is small.

It is difficult to decrease the area of the n-side electrode 16 to equal to or below the size of the bump for flip-chip mounting. However, in this embodiment, even if the area of the n-side electrode 16 is decreased, the copper interconnect layer 24 can be used for connection to a wider extraction electrode. If the area of the extraction electrode connected to the p-side electrode 14 is generally equal to the size of the extraction electrode connected to the n-side electrode 16, the device can be mounted on the substrate through the solder ball 36 in a balanced manner.

In FIG. 20B, the upper layer 12a including the light emitting layer 12e is placed at the center, and the n-type lower layer 12b is placed therearound. This can shorten the current supply path. Furthermore, because the light emitting region is located at the center, it can be readily aligned with the optical axis of the lens.

In FIG. 20C, the lower layer 12b is exposed at lattice-like positions where the n-side electrode 16 is provided, and the p-side electrode 14 is provided therearound. This can further shorten the current path.

In FIG. 20D, the p-side electrode 14 is placed at the center, and the n-side electrode 16 is placed at four corners therearound. This can further increase the light emitting region. Furthermore, because the light emitting region is located at the center, it can be readily aligned with the optical axis of the lens.

The first to fourth embodiments and the variations thereof can provide light emitting devices downsized close to the bare chip size. These light emitting devices can be widely used in, for example, illumination devices, display devices, and backlight sources for image display devices.

Furthermore, in the manufacturing method therefor, the assembly and inspection process can be performed at wafer level, which facilitates achieving high productivity. Hence, cost reduction can be achieved.

The embodiments of the invention have been described with reference to the drawings. However, the invention is not limited thereto. Those skilled in the art can variously modify the size, shape, material, layout and the like of the light emitting element, multilayer body, translucent substrate, seed metal, metal interconnect layer, metal pillar, reinforcing resin, phosphor layer, lens, and electrode constituting the embodiments of the invention, and such modifications are also encompassed within the scope of the invention as long as they do not depart from the spirit of the invention.

The invention claimed is:

1. A method for manufacturing a light emitting device, comprising:
   removing a substrate from a multilayer body with a stacking structure being supported on a support and the support being external surface of the light emitting device on a surface opposite to the substrate,
   the stacking structure including:
      the substrate;
      the multilayer body including a first surface adjacent to the substrate, a second surface opposite to the first surface, and a light emitting layer;
      a p-side electrode and an n-side electrode formed on the second surface, one of the p-side electrode and the n-side electrode formed on the light emitting layer, another electrode formed on a portion not including the light emitting layer in the multilayer body;
      a dielectric film formed on the p-side electrode and the n-side electrode, the dielectric film having a first opening communicating the p-side electrode and a second opening communicating the n-side electrode;
      a p-side metal interconnect layer provided on the dielectric film and connected to the p-side electrode through the first opening; and
      an n-side metal interconnect layer provided on the dielectric film apart from the p-side metal interconnect layer and connected to the n-side electrode through the second opening, and
   the support including:
      a p-side metal pillar provided on the p-side metal interconnect layer;
      an n-side metal pillar provided on the n-side metal interconnect layer; and
      a filling layer filled in a space between the p-side metal interconnect layer and the n-side metal interconnect layer, and in a space between the p-side metal pillar and the n-side metal pillar.

2. A method for manufacturing a light emitting device, comprising:
   forming a dielectric film having a first opening and a second opening on a p-side electrode and an n-side electrode, and a seed metal covering the first and second openings, the p-side electrode and the n-side electrode formed on a second surface of a multilayer body, the multilayer body including a light emitting layer, a first surface adjacent to a first surface side of a substrate and the second surface opposite to the first surface, one of the p-side electrode and the n-side electrode formed on the light emitting layer, and another electrode formed on an non-emitting region of the multilayer body;
   forming a metal layer including a p-side metal interconnect layer and a metal layer including an n-side metal interconnect layer on the seed metal, an area of one of the p-side metal interconnect layer and the n-side metal interconnect layer, connected to the other electrode being larger on a surface opposite to the other electrode than on the other electrode side;
   separating the seed metal into a p-side seed metal and an n-side seed metal by removing a part of the seed metal, which is exposed between the p-side metal interconnect layer and the n-side metal interconnect layer;
   forming a support including the metal layer including the p-side metal interconnect layer, the metal layer including the n-side metal interconnect layer and a resin by filling the resin in a space given by the removing of the seed metal and in a space between the metal layer including the p-side metal interconnect layer and the metal layer including the n-side metal interconnect layer; and
   after the forming the support, removing the substrate from the multilayer body supported on the support with the metal layer including the p-side metal interconnect layer, the metal layer including the n-side metal interconnect layer and the resin being external surface of the light emitting device on a surface opposite to the substrate, wherein
   the forming of the metal layer including the p-side metal interconnect layer and the metal layer including the n-side metal interconnect layer including forming a p-side metal pillar and an n-side metal pillar on the p-side metal interconnect layer provided on the seed metal and the n-side metal interconnect layer provided on the seed metal, respectively.

3. The method according to claim 2, wherein the forming a p-side metal interconnect layer and an n-side metal interconnect layer includes forming by electrolytic plating.

4. The method according to claim 2, wherein the forming a p-side metal pillar and an n-side metal pillar includes forming by electrolytic plating.

5. The method according to claim 2, further comprising:
   forming a lens material on the first surface side of the multilayer body;
   further forming a mask material on the lens material; and
   then etching the lens material under a condition that the lens material has a lower selective ratio than the mask material.

6. The method according to claim 2, further comprising:
   applying a liquid glass on the first surface side of the multilayer body, and forming a lens by mold press.

7. The method according to claim 2, wherein,
   the forming a multilayer body includes forming a first and second multilayer bodies spaced from and being adjacent to each other,
   the forming a p-side metal interconnect layer and an n-side metal interconnect layer includes connectedly forming a first p-side metal interconnect layer provided on the first multilayer body side and a second n-side metal interconnect layer provided on the second multilayer body side, and
   the separating the seed metal into a p-side seed metal and an n-side seed metal includes removing the seed metal exposed between a first n-side metal interconnect layer provided on the first multilayer body side and the first p-side metal interconnect layer to separate it into a first n-side seed metal and a first p-side seed metal, and removing the seed metal exposed between a second p-side metal interconnect layer provided on the second multilayer body side and the second n-side metal interconnect layer to separate it into a second p-side seed metal and a second n-side seed metal.

8. The method according to claim 1, further comprising:
   covering the dielectric film, the first opening and the second opening with a continuous metal film before forming the p-side metal interconnect layer and the n-side metal interconnect layer.

9. The method according to claim 1, wherein the filling layer is formed at a periphery of each of the p-side metal interconnect layer, the n-side metal interconnect layer, the p-side metal pillar and the n-side metal pillar.

10. The method according to claim 1, wherein the substrate is removed from the multilayer body by laser irradiation.

11. The method according to claim 1, further comprising:
forming a layer including a phosphor on the first surface side of the multilayer body after the removing the substrate from the multilayer body.

12. The method according to claim 1, further comprising:
singulating the light emitting device after the removing the substrate from the multilayer body.

13. The method according to claim 1, wherein,
the one of the p-side electrode and the n-side electrode is the p-side electrode,
the other electrode is the n-side electrode, and
the n-side metal interconnect layer is partially-overlapped with the light emitting layer.

14. The method according to claim 8, further comprising:
removing the metal film exposed between the p-side metal interconnect layer and the n-side metal interconnect layer after forming the p-side metal interconnect layer and the n-side metal interconnect layer on the metal film, wherein
the filling layer being filled in a portion given by the removing of the metal film.

15. The method according to claim 2, wherein the forming a multilayer body includes forming multilayer bodies spaced from each other.

16. The method according to claim 2, wherein the seed metal continuously covers the first and second openings.

* * * * *